(12) United States Patent
Ibn-Elhaj et al.

(10) Patent No.: US 10,141,512 B2
(45) Date of Patent: Nov. 27, 2018

(54) CONDUCTING AND SEMI-CONDUCTING ALIGNMENT MATERIALS

(71) Applicant: ROLIC AG, Zug (CH)

(72) Inventors: Mohammed Ibn-Elhaj, Allschwil (CH); Frédéric Lincker, Schiltigheim (FR)

(73) Assignee: ROLIC AG, Zug (CH)

( * ) Notice: Subject to any disclaimer, the term of this patent is extended or adjusted under 35 U.S.C. 154(b) by 0 days.

(21) Appl. No.: 15/035,523

(22) PCT Filed: Nov. 21, 2014

(86) PCT No.: PCT/EP2014/075227
§ 371 (c)(1),
(2) Date: May 10, 2016

(87) PCT Pub. No.: WO2015/078775
PCT Pub. Date: Jun. 4, 2015

(65) Prior Publication Data
US 2016/0276592 A1 Sep. 22, 2016

(30) Foreign Application Priority Data

Nov. 28, 2013 (EP) .................................... 13194746

(51) Int. Cl.
| | | |
|---|---|---|
| *C08G 63/00* | (2006.01) | |
| *H01L 51/00* | (2006.01) | |
| *C08G 61/12* | (2006.01) | |
| *H01L 51/05* | (2006.01) | |
| *H01L 51/42* | (2006.01) | |
| *H01L 51/50* | (2006.01) | |
| *H01L 51/52* | (2006.01) | |

(52) U.S. Cl.
CPC ........ *H01L 51/0036* (2013.01); *C08G 61/126* (2013.01); *H01L 51/0039* (2013.01); *H01L 51/0043* (2013.01); *C08G 2261/11* (2013.01); *C08G 2261/12* (2013.01); *C08G 2261/128* (2013.01); *C08G 2261/135* (2013.01); *C08G 2261/143* (2013.01); *C08G 2261/146* (2013.01); *C08G 2261/148* (2013.01); *C08G 2261/149* (2013.01); *C08G 2261/1414* (2013.01); *C08G 2261/1424* (2013.01); *C08G 2261/1426* (2013.01); *C08G 2261/216* (2013.01); *C08G 2261/228* (2013.01); *C08G 2261/3142* (2013.01); *C08G 2261/3223* (2013.01); *C08G 2261/3243* (2013.01); *C08G 2261/3246* (2013.01); *C08G 2261/344* (2013.01); *C08G 2261/76* (2013.01); *C08G 2261/77* (2013.01); *C08G 2261/91* (2013.01); *C08G 2261/92* (2013.01); *C08G 2261/94* (2013.01); *C08G 2261/95* (2013.01); *H01L 51/0012* (2013.01); *H01L 51/0512* (2013.01); *H01L 51/42* (2013.01); *H01L 51/5012* (2013.01); *H01L 51/5296* (2013.01)

(58) Field of Classification Search
CPC .... C08G 2261/1426; C08G 2261/3243; C08G 2261/124; C08G 2261/414; C08G 2261/91; H01L 51/0036; H01L 51/0047; H01L 51/4253; Y02E 10/549
See application file for complete search history.

(56) References Cited

U.S. PATENT DOCUMENTS

| | | |
|---|---|---|
| 5,272,234 A | 12/1993 | Chen et al. |
| 7,718,999 B2 | 5/2010 | Li et al. |
| 2012/0073662 A1 | 3/2012 | Swager et al. |
| 2013/0299805 A1 | 11/2013 | O'Neill et al. |
| 2014/0192305 A1 | 7/2014 | Lincker et al. |
| 2014/0249244 A1 | 9/2014 | Chappellet et al. |
| 2014/0342086 A1 | 11/2014 | Ibn-Elhaj et al. |

FOREIGN PATENT DOCUMENTS

| | | |
|---|---|---|
| EP | 1 932 865 A2 | 6/2008 |
| GB | 2 225 008 A | 5/1990 |
| JP | 2005-008860 A | 1/2005 |
| JP | 2010-043217 A | 2/2010 |
| WO | 2012/098410 A1 | 7/2012 |
| WO | 2013/026691 A1 | 2/2013 |
| WO | 2013/050121 A1 | 4/2013 |
| WO | 2013/050122 A1 | 4/2013 |

OTHER PUBLICATIONS

Leng et al. (Polym Int 2013; 62: 1187-1191).*
Vyprachticky et al. Macromol. Symp. 2010, 295, 94-9.*
R. Pizzoferrato, et at, "Optical characterization of alkyl-thiophenic monomers functionalized with second-order nonlinear chromophores", Chemical Physics Letters, Aug. 3, 2011, pp. 205-211, vol. 343, No. 3-4.
Rafaël Kiebooms, et at, "Synthesis, Electrical, and Optical Properties of Conjugated Polymers", Handbook of Advanced Electronic and Photonic Materials and Devices, Jan. 1, 2001, pp. 1-102, vol. 8.
Andrew C. Grimsdale, et al., "Synthesis of Light-Emitting Conjugated Polymers for Applications in Electroluminescent Devices", Chem. Rev., American Chemical Society, Feb. 1, 2009, pp. 897-1091, vol. 109, No. 3.
Yunli Han, et al., "Diketopyrrolopyrrole-Based Liquid Crystalline Conjugated Donor-Acceptor Copolymers with Reduced Band Gap for Polymer Solar Cells", Journal of Polymer Science Part A: Polymer Chemistry, Oct. 23, 2012, pp. 258-266, vol. 51, No. 2.
Vasilis P. Barberis, et al., "Coumarin-Containing Poly(fluorenediylvinylene)s: Synthesis, Photophysics, and Electroluminescence", Journal of Polymer Science Part A: Polymer Chemistry, Aug. 25, 2006, pp. 5750-5762, vol. 44, No. 19.

(Continued)

*Primary Examiner* — Shane Fang
(74) *Attorney, Agent, or Firm* — Sughrue Mion, PLLC

(57) ABSTRACT

The invention relates to conducting and semi-conducting photoreactive compounds, represented by the general formula (I), to the use of these compounds for the preparation of oriented and/or orientation layers; and to their use in the construction of unstructured and structured optical, electro optical or optoelectronic elements and multi-layer systems.

9 Claims, No Drawings

(56) References Cited

OTHER PUBLICATIONS

Hua Tan, et al., "Improving Optoelectronic Properties of the 2,7-Polyfluorene Derivatives with Carbazole and Oxadiazole Pendants by Incorporating the Blue-Emitting Iridium Complex Pendants in C-9 Position of Fluorine Unit", Journal of Polymer Science Part A: Polymer Chemistry, Oct. 11, 2011, pp. 149-155, vol. 50, No. 1.

Hsiao-Hsien Sung, et al., "Synthesis and Characterization of Poly(fluorene)-Based Copolymers Containing Various 1,3,4-Oxadiazole Pendants", Journal of Polymer Science Part A: Polymer Chemistry, May 26, 2005, pp. 2700-2711, vol. 43, No. 13.

Cheng Yang, et al., "Pure blue light-emitting fluorene-based conjugated polymer with excellent thermal, photophysical, and electroluminescent properties", Journal of Materials Science, May 31, 2013, pp. 6719-6727, vol. 48, No. 19.

T. Senthilkumar, et al., "Self-Assembly in Tailor-Made Polyfluroenes: Synergistic Effect of Porous Spherical Morphology and FRET for Visual Sensing of Bilirubin", Macromolecules, Mar. 26, 2013, pp. 2159-2171, vol. 46, No. 6.

Myung Hee Han, et al., "White polymer light-emitting diode materials with efficient electron injection backbone containing polyfluorene, oxadiazole and quinoxaline derivatives", Synthetic Metals, Dec. 1, 2012, pp. 2294-2301, vol. 162, No. 24.

R. Molina, et al., "A Novel $_L$-Tyrosine Derivative of Poly[(fluoren-2,7-diyl)-alt-co-(benzen-1,4-diyl)]: Strategy of Synthesis and Chiroptical and Electrochemical Characterization", Macromolecules, May 1, 2007, pp. 3042-3048, vol. 40, No. 9.

Kai Yao, et al., "Orientation Behavior of Bulk Heterojunction Solar Cells Based on Liquid-Crystalline Polyfluorene and Fullerene", Journal of Physical Chemistry C, Oct. 21, 2010, pp. 18001-18011, vol. 114, No. 41.

Shuhei Yamada, et al., "Synthesis and characterization of fluorene-carbazole and fluorene-phenothiazine copolymers with carbazole and oxadiazole pendants for organic light emitting diodes", Polymer, Dec. 10, 2010, pp. 6174-6181, vol. 51, No. 26.

Kai Yao, et al., "Mesogens Mediated Self-Assembly in Applications of Bulk Heterojunction Solar Cells Based on a Conjugated Polymer with Narrow Band Gap", Macromolecules, Apr. 26, 2011, pp. 2698-2706, vol. 44, No. 8.

Marta Castelain, et al., "Supramolecular assembly of graphene with functionalized poly(fluorene-alt-phenylene): the role of the anthraquinone pendant groups", Chemical Communications, Jan. 1, 2011, pp. 7677-7679, vol. 47, No. 27.

Chengmei Zhong, et al., "Highly Efficient Electron Injection from Indium Tin Oxide/Cross-Linkable Amino-Functionalized Polyfluorene Interface in Inverted Organic Light Emitting Devices", Chemistry of Materials, Nov. 8, 2011, pp. 4870-4876, vol. 23, No. 21.

Kai Yao, et al., "Tuning the photovoltaic parameters of thiophene-linked donor-acceptor liquid crystalline copolymers for organic photovoltaics", Polymer Chemistry, Jan. 1, 2012, p. 710-717, vol. 3, No. 3.

Ângela C.B. Neves, et al., "Routes to synthesis of porphyrins covalently bound to poly(carbazole)s and poly(fluorene)s: Structural and computational studies on oligomers", Journal of Molecular Structure, Dec. 1, 2012, pp. 199-208, vol. 1029.

Yen-Ju Cheng, et al., "Synthesis of Conjugated Polymers for Organic Solar Cell Applications", Chemical Reviews, Nov. 11, 2009, pp. 5868-5923, vol. 109, No. 11.

D. Tyler McQuade, et al., "Conjugated Polymer-Based Chemical Sensors", Chemical Reviews, American Chemical Society, Sep. 6, 2000, pp. 2537-2574, vol. 100, No. 7.

Amaresh Mishra, et al., "Functional Oligothiophenes: Molecular Design for Multidimensional Nanoarchitectures and Their Applications", Chemical Reviews, Mar. 11, 2009, vol. 109, No. 3.

International Search Report for PCT/EP2014/075227 dated Sep. 7, 2015 [PCT/ISA/210].

Written Opinion for PCT/EP2014/075227 dated Sep. 7, 2015 [PCT/ISA/237].

Wang et al., "Preparation and Characterization of a Novel Poly(1,4-Phenylenevinylene) Derivative with an Azobenzene Side Chain," Macromol. Rapid Commun., vol. 20, 1999, pp. 591-594.

Kim et al., "Efficient Poly(p-Phenylenevinylene) Derivative with 1,2-Diphenyl-2'-Cyanoethene for Single Layer Light-Emitting Diodes," Synthetic Metals, vol. 139, 2003, pp. 471-478.

* cited by examiner

CONDUCTING AND SEMI-CONDUCTING ALIGNMENT MATERIALS

The invention relates to conducting and semi-conducting photoreactive compounds, represented by the general formula (I), to the use of these compounds for the preparation of oriented and/or orientation layers; and to their use in the construction of unstructured and structured optical, electro optical or optoelectronic elements and multi-layer systems, preferably for OLET (Organic Light Emitting Transistor), OFET (Organic Field Effect Transistor), OLED (Organic Light-Emitting Diode), Sensor (i.e. detection of physical, chemical or biological stimuli), OPV (Organic PhotoVoltaic), or the combination of at least two of these elements and systems.

The present invention relates to a compound, of formula (I)

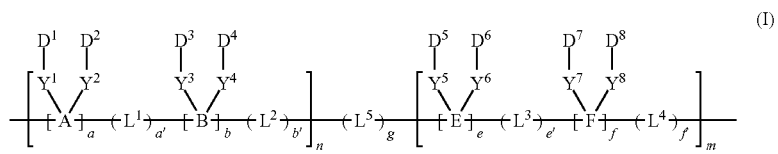

wherein
A, B, E and F independently from each other represents an unsaturated aliphatic group;

or A, B, E and F independently from each other represent an unsubstituted or substituted carbocyclic or heterocyclic aromatic group preferably selected from an unsubstituted or substituted monocyclic ring of three, four, five, six, eight, nine, ten, eleven, twelve, thirteen or fourteen atoms, or an unsubstituted or substituted polycyclic ring of at least two separate rings, or/and at least two condensed monocyclic rings of three, four, five, six, eight, nine, ten, eleven, twelve, thirteen or fourteen atoms, preferably an unsubstituted or substituted carbocyclic or heterocyclic aromatic group is selected form thiophene, fluorene, silafluorene, carbazole, pyridine, pyridazine, pyrimidine, phenylene, furan, pyrrol, and their derivatives;

$L^1$, $L^2$, $L^3$ $L^4$ and $L^5$ independently from each other represent a bridging group, which is preferably a single bond, —NH, —PH, —CH=CH—, —CR$^5$=CH—, —C≡C— or a metalic system.

a, b, e and f are independently from each other of 1 to 0, with the proviso that the sum of a+b=1 and e+f=1, a', b', e' and f' are independently from each other egal to a, b, e and f respectively g is 0 or 1, n and m are independently from each other 0 to 10000, preferably 0 to 1000, more preferably 0 to 200, that at least n+m is ≥2, $Y^1$, $Y^2$, $Y^3$, $Y^4$, $Y^5$, $Y^6$, $Y^7$ and $Y^8$ are independently from each other a spacer, and $D^1$, $D^2$, $D^3$, $D^4$, $D^5$, $D^6$, $D^7$ and $D^8$ are independently from each other a hydrogen, —R$^1$, a halogene or a photoalignment group;

wherein R$^1$ is a cyclic, straight-chain or branched, substituted or unsubstituted $C_1$-$C_{24}$alkyl, wherein one or more, preferably non-adjacent, CH$_2$, C, CH groups may independently from each other be replaced by a linking group and/or a non-aromatic, aromatic, unsubstituted or substituted carbocyclic or heterocyclic group connected via bridging groups;

with the proviso that at least one $D^1$, $D^2$, $D^3$, $D^4$, $D^5$ $D^6$, $D^7$ and $D^8$ is a photoalignment group;

and preferably with the further proviso, that if A is fluorene and m, g=0 and a=1 and $D^1$ and $D^2$ are independently from each other a photoalignment group, then a photoalignment group which is a cinnamate of formula —OCO—CH=CH-phenylen-(R), wherein R is hydrogen a to CN, a $C_1$-$C_5$alkoxy group, a halogen atom or a maleinimide group is excluded.

In the context of the present invention the wording slave material shall refer to any material that has the capability to establish anisotropy upon contact with a photo-aligned material. The nature of the anisotropy in the photo-aligned material and in the slave material may be different from each other. For example, the slave material may exhibit an improvement of the order degree and/or optical or electronical anisotropy. There may be also moieties of the photo-alignable material, for example in a co-polymer, which are not sensitive to aligning light, but create anisotropic properties because of interaction with the photo-sensitive moieties, which undergo a photo-reaction upon exposure to aligning light. Such a material exhibits properties of a photo-alignable material and of a slave material, but shall be included in the meaning of a photo-alignable material.

A slave material may comprise polymerizable and/or non-polymerizable compounds. Within the context of the present application the terms "polymerizable" and "polymerized" shall include the meaning of "cross-linkable" and "cross-linked", respectively. Likewise, "polymerization" shall include the meaning of "cross-linking".

Preferably, the slave material is an inorganic or organic material or inorganic/organic hybride material; preferably organic materials or inorganic/organic hybrides. More preferably organic materials; most preferably a polymerizable and/or non-polymerizable crystal, or a soft material comprising liquid crystals, colloids, polymers, foams, gels, granular materials, and a number of biological materials, especially a soft material is a liquid crystal and/or a polymer.

In the context of the present invention the term spacer is preferably a single bond or, a cyclic, straight-chain or branched, substituted, preferably substituted by halogene, especially bromo; or unsubstituted $C_1$-$C_{24}$alkylene, wherein one or more, preferably non-adjacent, CH$_2$, C, CH groups may independently from each other be replaced by a linking group and/or a non-aromatic, aromatic, unsubstituted or substituted carbocyclic or heterocyclic group connected via bridging groups, In the context of the present invention an alicyclic ring represents for example ring systems, with 1 to 40 carbon atoms, preferably $C_1$-$C_{40}$ carbon atoms as for example cyclopropane, cyclobutane, cyclopentane, cyclopentene, cyclohexane, cyclohexene, cyclohexadiene, decaline, tetrahydrofuran, dioxane, pyrrolidine, piperidine or a steroidal skeleton such as cholesterol, which are uninterrupted or interrupted by at least a single heteroatom and/or at least a single bridging group, or rod shaped groups, such as bi-, tri, or tetra-cyclohexyl, 1,4-phenylene-(1,4-cyclohexylene)$_p$, wherein p is 1, 2, 3 or 4; and preferred are cyclohexane or a steroidal skeleton.

In the context of the present invention the wording bridging group is preferably selected from —CH═CH—, —CR$^5$′═CR$^5$—, —C≡C—, —CR$^5$═N—, —C(CH3)═N—, —N═N—, —NR$^6$—, —PR$^6$— or a single bond, wherein R$^5$, R$^{5'}$, R$^6$ are independently from each other hydrogen or C$_1$-C$_6$alkyl; or a cyclic, straight-chain or branched, substituted or unsubstituted C$_1$-C$_{24}$alkylen, wherein one or more CH$_2$ groups may independently from each other be replaced by a linking group as described below.

More preferably the bridging group is a single bond, —NH, —CR$^5$′═CR$^5$— or —C≡C—.

The term "linking group", as used in the context of the present invention is preferably be selected from —O—, —CO, —CO—O—, —O—CO—,

—NR$^6$—, —NR$^6$—CO—, —CO—NR$^6$—, —NR$^6$—CO—O—, —O—CO—NR$^6$—, —NR$^6$CO—NR$^6$—, —CH═CH—, —C≡C—, —O—CO—O—, and —Si(CH$_3$)$_2$—O—Si(CH$_3$)$_2$—, and wherein:

R$^6$ represents a hydrogen atom or C$_1$-C$_6$alkyl;

with the proviso that oxygen atoms of linking groups are not directly linked to each other.

In the context of the present invention the wording photoalignment group has the meaning of anisotropically absorbing groups. In general photoalignment groups are useful in the preparation of oriented materials and/or oriented layers and/or alignment layers.

In a preferred embodiment of the present invention the photoalignment group exhibits an improvement of the order degree and/or optical or electronical anisotropy.

Preferred photoalignment groups dimerize and/or to undergo trans-cis isomerization and/or polymerization and/or cross-links and/or which are able to photo-degradate, preferably they are able to undergo trans-cis isomerisation and/or dimerize and more preferably they are able to dimerize.

Preferably a cinnamate-, stilbene-, cyanostilbene-group; or a coumarine-, quinoline-, azo-, chalcone-, diphenylacetylene, benzylidenephtalimidine, benzylideneacetophenone, phenylenediacryloyl, stilbazole and/or azo-group;

most preferred are cinnamate-, coumarine-, quinoline-, cyanostilbene-, and/or chalcone-groups;

especially most preferred are cinnamate- and cyanostilbene groups.

In the context of the present application, the term "aligning light" shall mean light, which can induce anisotropy in a photo-alignable material and which is at least partially linearly or elliptically polarized. Preferably, the aligning light is linearly polarized with a degree of polarization of more than 5:1. Wavelengths, intensity and energy of the aligning light are chosen depending on the photosensitivity of the photo-alignable material. Typically, the wavelengths are in the UV-A, UV-B and/or UV-C range or in the visible range. Preferably, the aligning light comprises light of wavelengths less than 450 nm. More preferred is that the aligning light comprises light of wavelengths less than 420 nm.

If the aligning light is linearly polarized, the polarization plane of the aligning light shall mean the plane defined by the propagation direction and the polarization direction of the aligning light. In case the aligning light is elliptically polarized, the polarization plane shall mean the plane defined by the propagation direction of the light and by the major axis of the polarization ellipse.

Alkyl, alkyloxy, alkylcarbonyloxy, acryloyloxyalkoxy, acryloyloxyalkyl, acryloyloxyalken, alkyloxycarbonyloxy, alkylacryloyloxy, methacryloyloxyalkoxy, methacryloyloxyalkyl, methacryloyloxyalken, alkylmethacryloyloxy, alkylmethacryloyloxy, alkylvinyl, alkylvinyloxy and alkylallyloxy and alkylene, as used in the context of the present invention denote with their alkyl residue, respectively their alkylene residue, a cyclic, straight-chain or branched, substituted or unsubstituted alkyl, respectively alkylene, in which one or more, preferably non-adjacent, —CH$_2$— group may be replaced by a linking group.

Further, the alkyl residue is for example C$_1$-C$_{40}$alkyl, especially C$_1$-C$_{30}$alkyl, preferably C$_1$-C$_{20}$alkyl, more preferably C$_1$-C$_{16}$alkyl, most preferably C$_1$-C$_{10}$alkyl and especially most preferably C$_1$-C$_6$alkyl. Accordingly alkylen is for example C$_1$-C$_{40}$alkylen, especially C$_1$-C$_{30}$alkylen, preferably C$_1$-C$_{20}$alkylen, more preferably C$_1$-C$_{16}$alkylen, most preferably C$_1$-C$_{10}$alkylen and especially most preferably C$_1$-C$_6$alkylen.

In the context of the present invention the definitions for alkyl given below, are applicable to alkylene in analogy.

C$_1$-C$_6$alkyl is for example methyl, ethyl, propyl, isopropyl, butyl, sec.-butyl, tert.-butyl, pentyl or hexyl.

C$_1$-C$_{10}$alkyl is for example methyl, ethyl, propyl, isopropyl, butyl, sec.-butyl, tert.-butyl, pentyl, hexyl, heptyl, octyl, nonyl, decyl.

C$_1$-C$_{16}$alkyl is for example methyl, ethyl, propyl, isopropyl, butyl, sec.-butyl, tert.-butyl, pentyl, hexyl, heptyl, octyl, nonyl, decyl, undecyl, dodecyl, tridecyl, tetradecyl, pentadecyl or hexadecyl.

C$_1$-C$_{20}$alkyl is for example methyl, ethyl, propyl, isopropyl, butyl, sec.-butyl, tert.-butyl, pentyl, hexyl, heptyl, octyl, nonyl, decyl, undecyl, dodecyl, tridecyl, tetradecyl, pentadecyl, hexadecyl, heptadecyl, octadecyl, nondecyl, eicosyl.

C$_1$-C$_{24}$alkyl is for example methyl, ethyl, propyl, isopropyl, butyl, sec.-butyl, tert.-butyl, pentyl, hexyl, heptyl, octyl, nonyl, decyl, undecyl, dodecyl, tridecyl, tetradecyl, pentadecyl, hexadecyl, heptadecyl, octadecyl, nondecyl, eicosyl.

C$_1$-C$_{30}$alkyl is for example methyl, ethyl, propyl, isopropyl, butyl, sec.-butyl, tert.-butyl, pentyl, hexyl, heptyl, octyl, nonyl, decyl, undecyl, dodecyl, tridecyl, tetradecyl, pentadecyl, hexadecyl, heptadecyl, octadecyl, nondecyl, eicosyl, heneicosyl, tricosyl, tetracosy, pentacosyl, hexacosdy, heptacosyl, octacosyl, nonacosy or triacontyl.

C$_1$-C$_{40}$alkyl is for example methyl, ethyl, propyl, isopropyl, butyl, sec.-butyl, tert.-butyl, pentyl, hexyl, heptyl, octyl, nonyl, decyl, undecyl, dodecyl, tridecyl, tetradecyl, pentadecyl, hexadecyl, heptadecyl, octadecyl, nondecyl, eicosyl, heneicosyl, tricosyl.

In the context of the present invention the wording unsubstituted or substituted carbocyclic or heterocyclic aromatic group selected from an unsubstituted or substituted monocyclic ring of three, four, five, six, eight, nine, ten, eleven, twelve, thirteen or fourteen atoms, or an unsubstituted or substituted polycyclic ring of at least two separate rings, or/and at least two condensed monocyclic rings of three, four, five, six, eight, nine, ten, eleven, twelve, thirteen or fourteen atoms, wherein the polycyclic rings are uninterrupted or interrupted by at least a single heteroatom and/or at least a single bridging group.

Preferably, a polycyclic ring of at least two separate rings or condensed rings is e.g. an unsubstituted or substituted biphenylene, triphenylen, or naphthalene, thienothiophene, benzofuran, indol, benzothiophene, benzimidazole, imidazole, benzoaxazole, benzisoxazole, benzofuran, isoindol, benz[c]thiophene, purine, benzothiadiazol, chinoline, chinoaxaline, chinazolin, cinnolin, benzothiazolpyropine, diketopyrrolopyrrole, anthracene, benzopyrene, acenathalyne, acenaphthene, fluoren, phenanthrene, tetracene, pentacene, pentaphene, hexacene, hetacene, heptaphene, fluoranthen, benzanthracen, coronene, ovalene, chrysene, phenalene, pyrene, perylene, trinaphthylene, superphenalene or tetraline;

more preferably an unsubstituted or substituted biphenylene, triphenylen, or naphthalene, thienothiophene, benzofuran, indol, benzothiophene, benzimidazole, imidazole, benzoaxazole, benzisoxazole, benzofuran, isoindol, benz[c]thiophene, purine, benzothiadiazol, chinoline, chinoaxaline, chinazolin, cinnolin, benzothiazolpyropine, diketopyrrolopyrrole, most preferably is an unsubstituted or substituted biphenylene, thienothiophene, benzofuran, indol, benzothiophene, benzimidazole, imidazole, benzoaxazole, benzisoxazole, benzofuran, isoindol, benzothiadiazol, chinoaxaline, benzothiazol, diketopyrrolopyrrole, The carbocyclic or heterocyclic aromatic group is for example unsubstituted or mono- or poly-substituted. Preferred substitutents of carbocyclic or heterocyclic aromatic groups are at least one halogen, hydroxyl, a polar group, acryloyloxy, alkylacryloyloxy, alkoxy, alkylcarbonyloxy, alkyloxycarbonyloxy, alkyloxocarbonyloxy, methacryloyloxy, vinyl, vinyloxy and/or allyloxy group, wherein the alkyl residue has preferably from 1 to 20 carbon atoms, and more preferably having from 1 to 10 carbon atoms. Preferred polar groups are nitro, cyano or a carboxy group, and/or a cyclic, straight-chain or branched $C_1$-$C_{30}$alkyl, which is unsubstituted, mono- or poly-substituted. Preferred substitutents of $C_1$-$C_{30}$alkyl are methyl, fluorine and/or chlorine, wherein one or more, preferably non-adjacent, —$CH_2$— group may independently of each other be replaced by a linking group. Preferably, the linking group is selected from —O—, —CO—, —COO— and/or —OCO—.

In the context of the present invention a monocyclic ring is represented by an aromatic ring having three, four, five, six, eight, nine, ten, eleven, twelve, thirteen or fourteen atoms, which is uninterrupted or interrupted by at least a single heteroatom or a bridging group. Preferably a monocyclic ring is represented by cyclopropenyl cation, furan, thiopene, selenophene, pyrrol, imidazole, pyrazole, oxazole, isoxazole, thiazole, benzene, pyridine, pyrazine, pyrimidine, pyridazine, preferably thiophene, furan, pyrrol, selnophene, benzene.

A bicyclic ring system of eight, nine or ten atoms is for example naphthalene, biphenylene or tetraline.

A tricyclic ring system of thirteen or fourteen atoms is for example phenanthrene.

The term "phenylene", as used in the context of the present invention, preferably denotes a 1,2-, 1,3- or 1,4-phenylene group, which is optionally substituted. It is preferred that the phenylene group is either a 1,3- or a 1,4-phenylene group. 1,4-phenylene groups are especially preferred.

The term "halogen" denotes a chloro, fluoro, bromo or iodo substituent.

The term "heteroatom", as used in the context of the present invention primarily denotes oxygen, sulphur and nitrogen, preferably oxygen and nitrogen, in the latter case preferably in the form of —NH—.

The term "optionally substituted" as used in the context of the present invention primarily means substituted by lower alkyl, such as $C_1$-$C_6$alkyl, lower alkoxy, such as $C_1$-$C_6$alkoxy, hydroxy, halogen or by a polar group as defined above.

A preferred embodiment of the present invention relates to compounds, of formula (II)

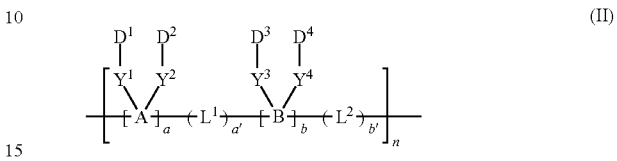

(II)

wherein

A, B, $L^1$, $L^2$, a, b, a', b', $Y^1$, $Y^2$, $Y^3$, $Y^4$, $D^1$, $D^2$, $D^3$, $D^4$ have the same meaning and preferences as given above, with the proviso that at least one $D^1$, $D^2$, $D^3$, $D^4$ is a photoalignment group;

and preferably with the further proviso, that if A is fluorene and a=1 and $D^1$ and $D^2$ are independently from each other a photoalignment group, then a photoalignment group which is a cinnamate of formula —OCO—CH═CH-phenylen-(R), wherein R is hydrogen a to CN, a $C_1$-$C_5$alkoxy group, a halogen atom or a maleinimide group is excluded.

More preferred is compound, of formula (II) within the above given meaning, with proviso that a and a' are 1 or 0, and b and b' are 0.

Further more preferred is compound, of formula (II) within the above given meaning, with proviso that a and b are independently from each other of 1 to 0.00001, with the proviso that the sum of a+b=1, and wherein a'=b'=0 or a'/a=b'/b=1

In general the compounds of formula (I) can be prepared by following methods well-known in the art, such as electropolymerization, oxidative polymerization, polycondensation reactions or homo- and cross-coupling reactions, such as Ullmann, Suzuki-Miyaura, Stille, Sonogashira, Negishi, Heck, Kumada-corriu, Rieke's and Mc Cullough's reactions,.

The present invention further relates to a method for the preparation of a compound of formula (I), which method comprises coupling at least two compounds of formula (III)

(III)

wherein $D^1$, $D^2$, $Y^1$, $Y^2$, and A have the meanings given above, and $LG^1$, $LG^2$ represent independently from each other hydrogen or a leaving group, preferably the leaving group is halogen, sulfonyl or a metal, especially a metal from the alkyli or earth alkyli metal; more preferably hydrogen, chlorine, bromine, iodide, p-toluenesulfonyl, (p-toluenesulfonyl chloride), p-bromobenzenesulfonyl, 2- or 4-nitrobenzenesulfonyl, methanesulfonyl, (methanesulfonyl chloride), trifluoromethanesulfonyl, 5-(dimethylamino)-naphthalene-1-sulfonyl; most preferred is hydrogen, chlorine, bromine, iodide, methanesulfonyl, p-toluenesulfonyl, trifluoromethanesulfonyl magnesium chloride, and lithium; preferably with the proviso that if A is fluorene and $D^1$ and $D^2$ are independently from each other a photoalignment group, then a photoalignment group which is a cinnamate of formula —OCO—CH=CH-phenylen-(R), wherein R is hydrogen a to CN, a $C_1$-$C_5$alkoxy group, a halogen atom or a maleinimide group is excluded.

The coupling is in general conducted in the presence of a catalysator, especially copper, palladium, nickel catalysts, lewis acids.

The present invention further relates to a compound of formula (III).

Further, the present invention relates to a composition comprising at least one compound of formula (I) and/or (II) and/or (III).

Further, the present invention relates to a polymer, copolymer or oligomer layer, comprising at least one compound of formula (I) or (II).

In addition, the present invention relates to a method for the preparation of a polymer layer, copolymer layer or oligomer layer, wherein one or more compound of formula (I) or (II) is applied to a support, and treated with aligning light.

In addition, the present invention relates to a polymer, copolymer or oligomer layer obtainable by the method as described above.

In addition, the present invention relates to an optical and electro optical or optoelectronic elements and multi-layer systems comprising at least one polymer layer, copolymer or oligomer layer as described above.

The present invention further relates to the use of compounds of formula (I). (II) or (III) for the preparation of oriented layers and/or orientation layers for slave materials, such as soft materials; or to their uses in the construction of unstructured and structured optical, electro optical and/or optoelectronic elements and multi-layer systems,

EXAMPLES

The examples which follow further illustrate the invention. They are given by way of illustration and not by way of limitation. Variations on these examples falling within the scope.

A) Synthesis Examples of Monomers and P-Types Polymers

Example A1

Preparation of 3-(6-bromohexyl)thiophene

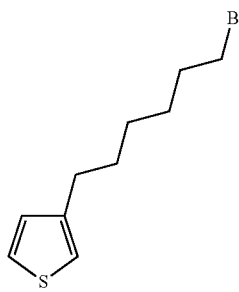

3-Bromothiophene (10.00 g, 61.335 mmol) is dissolved in 100 mL of hexane under argon. The solution is cooled down at −50° C. and the solution stirred for 10 minutes. n-BuLi 2.5 M in hexane (24.6 mL, 61.500 mmol) is added dropwise. 8 mL of THF is added to the pale yellow solution and the reacting mixture is stirred for 1 h. 1,6-Dibromohaxane (38.0 mL, 81.700 mmol) is added in one portion at −10° C. and the mixture is warmed to room temperature and stirred for 12 h.

The reaction is quenched by pouring 75 mL of water into the flask and extracted twice with tert-butyl-methyl-ether (2×75 mL). The organic layer is washed with water (3×50 mL), dried over anhydrous $MgSO_4$ and evaporated to dryness. The resulting pale yellow oil is purified by distillation and column chromatography ($SiO_2$, Heptane) to yield colourless oil (7.23 g, 48%). $^1$H NMR $CDCl_3$ 300 MHz: 7.24 (dd, 1H), 6.92 (m, 2H), 3.40 (t, 2H), 2.63 (t, 2H), 1.84 (m, 2H), 1.60 (m, 2H), 1.50-1.30 (m, 4H).

Example A2

Preparation of 2,5-dibromo-3-(6-bromohexyl)thiophene

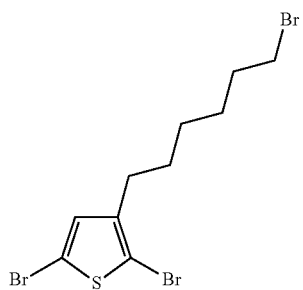 [SMILES: BrCCCCCCc1cc(Br)sc1Br]

3-(6-bromohexyl)thiophene (5.00 g, 20.227 mmol) is dissolved in 25 mL of dimethylformamide under argon. N-Bromosuccinimide (7.92 g, 44.499 mmol) in 40 mL of DMF is added dropwise to the clear solution at −20° C. The reaction mixture is stirred at room temperature for 12 h and is poured into cold water (50 mL). The organic layer is extracted three times dichloromethane. The organic layers are combined and washed with HCl 1N (3×30 mL), dried over anhydrous MgSO4 and concentrated under reduced pressure. The crude product is purified on column chromatography (SiO2, Heptane) to afford 2,5-dibromo-3-(6-bromohexyl)thiophene (6.55 g, 80%). $^1$H NMR $CDCl_3$ 300 MHz: 6.78 (s, 1H), 3.42 (t, 2H), 2.51 (t, 2H), 1.65-1.10 (m, 6H).

Example A3

Preparation of (E)-4-[4-[6-(2,5-dibromo-3-thienyl)hexoxy]phenyl]but-3-en-2-one

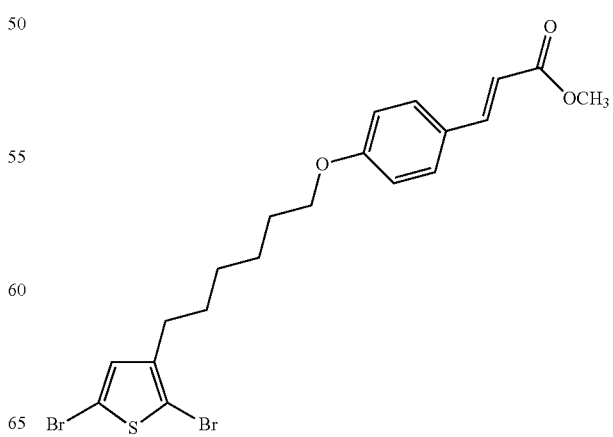

A mixture of 2,5-dibromo-3-(6-bromohexyl)thiophene (2516 mg, 6.212 mmol), (E)-4-(4-hydroxyphenyl)but-3-en-2-one (1165 mg, 6.538 mmol), and $K_2CO_3$ (4300 mg, 31.112 mmol) in 50 mL of dimethylformamide is stirred at 110° C. under Argon. After 12 h at 110° C., the reaction mixture is poured in HCl 1N and extracted twice with AcOEt. The organic layers are combined, washed with HCl 1N, washed with H2O, dried over anhydrous MgSO4 and evaporated to dryness. The crude product is purified on column chromatography ($SiO_2$, 15/85: AcOEt/Heptane) to afford (E)-4-[4-[6-(2,5-dibromo-3-thienyl)hexoxy]phenyl]but-3-en-2-one (1371 mg, 44%). $^1$H NMR $CDCl_3$ 300 MHz: 7.67 (d, 1H),7.48 (d, 2H), 6.90 (d, 2H), 6.79 8s, 1H), 6.33 (d, 1H), 4.00 (t, 2H), 3.81 (s, 3H), 2.54 (t, 2H), 1.82 (t, 2H), 1.65-1.35 (m, 6H); $^{13}$C NMR $CDCl_3$ 75 MHz: 167.8, 160.95, 144.59, 142.72, 130.91, 129.73, 126.95, 115.13, 114.83, 110.44, 108.07, 67.98, 51.57, 29.46, 29.34, 29.03, 28.87, 28.74, 25.78.

Example A4

Preparation of Polymer 1

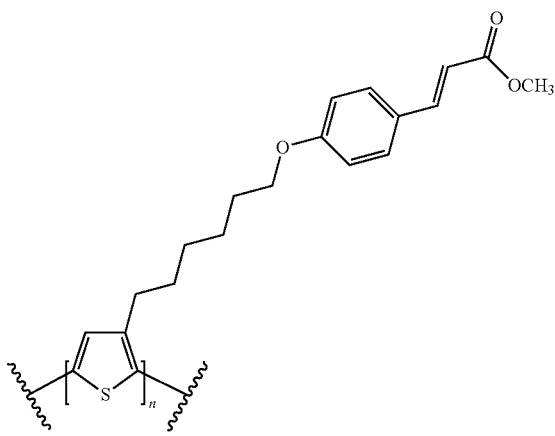

To a solution of (E)-4-[4-[6-(2,5-dibromo-3-thienyl)hexoxy]phenyl]but-3-en-2-one (1281 mg, 2.550 mmol) in 10 mL of THF is added dropwise 1.35 mL of isopropyl magnesium chloride (2.70 mmol, 2.0 M in THF) at −40° C. The reaction mixture is stirred at −40° C. for 1 h and a suspension of Ni(dppp)$Cl_2$ (13.5 mg, 0.0256 mmol) in 3 mL of THF is added. The resulting red solution is warmed to room temperature. After 12 h of stirring at room temperature, the reaction mixture is poured in HCl 1N (100 mL) and extracted twice with $CHCl_3$. The organic layers are combined, washed with water, dry on MgSO4, concentred and precipitated in cold MeOH. The filtrate is extracted by using Soxhlet with MeOH, Heptane, Acetone and finally with $CHCl_3$. The $CHCl_3$ fraction is evaporated to dryness to afford polymer 1 as dark purple crystal (672 mg, 77%). Size-exclusion chromatography (PS-equivalent), Mn 26,500; Mw 53,040; PDI 2.0. $^1$H NMR $CDCl_3$ 300 MHz: 7.62 (d, 1H), 7.42 (d, 2H), 7.00 (s 1H), 6.85 (d, 2H), 6.27 (d, 1H), 3.95 (t, 2H), 3.78 (s, 3H), 2.83 (t, 2H), 1.90-1.30 (m, 8H).

Example A5

Preparation of Polymer 2 (100% of Pre-grafting; DP100)

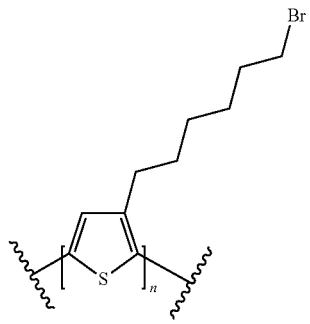

To a solution of 2,5-dibromo-3-(6-bromohexyl)thiophene (1810 mg, 4.469 mmol) in 18 mL of THF is added dropwise 2.4 mL of isopropyl magnesium chloride (4.80 mmol, 2.0 M in THF) at −40° C. The reaction mixture is stirred at −40° C. for 1 h and a suspension of Ni(dppp)$Cl_2$ (24.0 mg, 0.0454 mmol) in 5 mL of THF is added. The resulting red solution is warmed to room temperature. After 12 h of stirring at room temperature, the reaction mixture is poured in HCl 1N (100 mL) and extracted twice with $CHCl_3$. The organic layers are combined, washed with water, dry on MgSO4, concentred and precipitated in cold MeOH. The filtrate is extracted by using Soxhlet with MeOH, Heptane, Acetone and finally with $CHCl_3$. The $CHCl_3$ fraction is evaporated to dryness to afford polymer 2 as dark purple crystal (777 mg, 71%). Size-exclusion chromatography (PS-equivalent), Mn 19,600; Mw 28,600; PDI 1.46. $^1$H NMR $CDCl_3$ 300 MHz: 7.97 (s, 1H), 3.42 (t, 2H), 2.82 (t, 2H), 1.90-1.30 (m, 8H).

Example A6

Preparation of Polymer 3 (100% of Grafting)

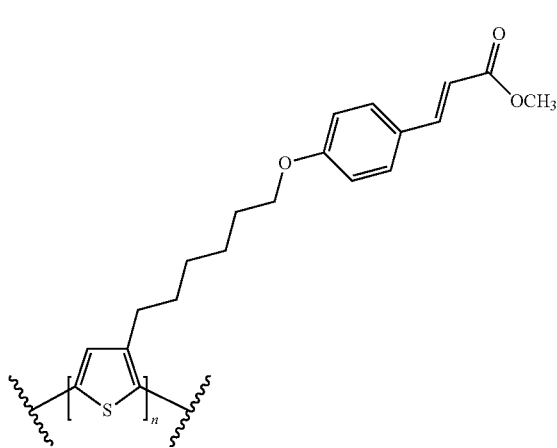

A mixture of polymer 2 (212 mg), (E)-4-(4-hydroxyphenyl)but-3-en-2-one (231 mg, 1.296 mmol), and $K_2CO_3$ (360 mg, 2.605 mmol) in a mixture of 10 ml of THF and 15 mL of DMF is stirred at 110° C. under Argon. After 12 h at 110° C., the reaction mixture is poured in HCl 1N and extracted twice with $CHCl_3$. The organic layers are combined, washed with HCl 1N, washed with H2O, dried over anhydrous MgSO4, concentrated and precipitated in cold MeOH. The filtrate is extracted by using Soxhlet with MeOH, Acetone and $CHCl_3$. The $CHCl_3$ fraction is evaporated to dryness to afford polymer 3 as dark purple crystal (80%). Size-exclusion chromatography (PS-equivalent), Mn 29,400; Mw 44,900; PDI 1.5. $^1$H NMR CDCl$_3$ 300 MHz: 7.62 (d, 1H), 7.42 (d, 2H), 7.00 (s 1H), 6.85 (d, 2H), 6.27 (d, 1H), 3.95 (t, 2H), 3.78 (s, 3H), 2.83 (t, 2H), 1.90-1.30 (m, 8H).

Example A7

Preparation of Polymer 4 (100% of Grafting)

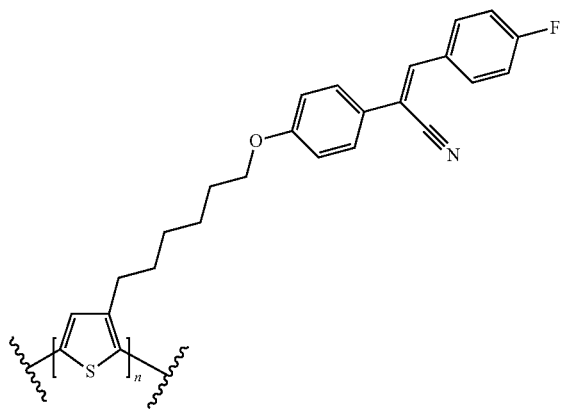

A mixture of polymer 2 (212 mg), (Z)-3-(4-fluorophenyl)-2-(4-hydroxyphenyl)prop-2-enenitrile (315 mg, 1.317 mmol), and K$_2$CO$_3$ (360 mg, 2.605 mmol) in a mixture of 10 ml of THF and 15 mL of DMF is stirred at 90° C. under Argon. After 12 h at 90° C., the reaction mixture is poured in HCl 1N and extracted twice with CHCl$_3$. The organic layers are combined, washed with HCl 1N, washed with H2O, dried over anhydrous MgSO4, concentrated and precipitated in cold MeOH. The filtrate is extracted by using Soxhlet with MeOH, Acetone and CHCl$_3$. The CHCl$_3$ fraction is evaporated to dryness to afford 295 mg of polymer 4 as dark purple crystal. Size-exclusion chromatography (PS-equivalent), Mn 21,300; Mw 36,100; PDI 5.9. $^1$H NMR CDCl$_3$ 300 MHz: 7.79 (d, 2H), 7.51 (d, 2H), 7.30 (s, 1H), 7.08 (d, 2H), 7.00 (s, 1H), 6.90 (d, 2H), 3.97 (t, 2H), 2.83 (t, 2H), 1.90-1.30 (m, 8H).

Example A8

Preparation of Polymer 5 (100% of Grafting)

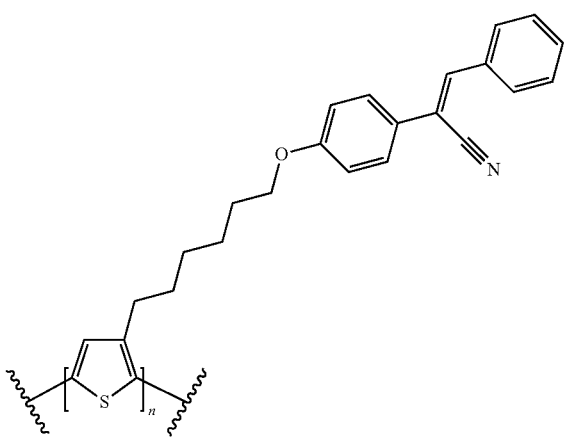

A mixture of polymer 2 (127 mg), (Z)-2-(4-hydroxyphenyl)-3-phenyl-prop-2-enenitrile (172 mg, 0.777 mmol), and K$_2$CO$_3$ (215 mg, 1.556 mmol) in a mixture of 9 ml of THF and 6 mL of DMF is stirred at 90° C. under Argon. After 12 h at 90° C., the reaction mixture is poured in HCl 1N and extracted twice with CHCl$_3$. The organic layers are combined, washed with HCl 1N, washed with H2O, dried over anhydrous MgSO4, concentrated and precipitated in cold MeOH. The filtrate is extracted by using Soxhlet with MeOH, Acetone and CHCl$_3$. The CHCl$_3$ fraction is evaporated to dryness to afford 150 mg of polymer 5 as dark purple crystal. Size-exclusion chromatography (PS-equivalent), Mn 23,900; Mw 34,200; PDI 1.4. $^1$H NMR CDCl$_3$ 300 MHz: 7.81 (d, 2H), 7.54 (d, 2H), 7.39 (m, 4H), 7.00 (s, 1H), 6.90 (d, 2H), 3.97 (t, 2H), 2.83 (t, 2H), 1.90-1.30 (m, 8H).

Example A9

Preparation of Polymer 6 (50% of Pre-grafting)

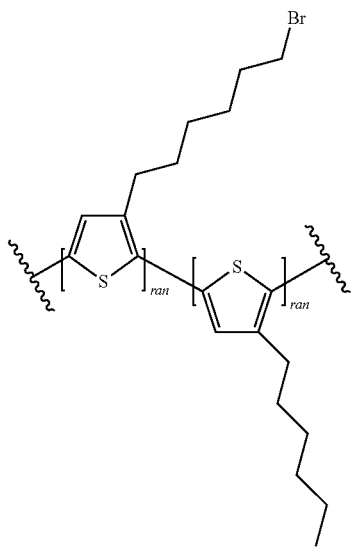

To a solution of 2,5-dibromo-3-(6-bromohexyl)thiophene (1810 mg, 4.469 mmol) and 2,5-dibromo-3-hexyl-thiophene (1458 mg, 4.4712 mmol) in 36 mL of THF is added dropwise 4.8 mL of isopropyl magnesium chloride (9.600 mmol, 2.0 M in THF) at −40° C. The reaction mixture is stirred at −40° C. for 1 h and a suspension of Ni(dppp)Cl$_2$ (48 mg, 0.091 mmol) in 10 mL of THF is added. The resulting red solution is warmed to room temperature. After 12 h of stirring at room temperature, the reaction mixture is poured in HCl 1N (100 mL) and extracted twice with CHCl$_3$. The organic layers are combined, washed with water, dry on MgSO$_4$, concentred and precipitated in cold MeOH. The filtrate is extracted by using Soxhlet with MeOH, Acetone and finally with CHCl$_3$. The CHCl$_3$ fraction is evaporated to dryness to afford polymer 6 as dark purple crystal (990 mg, 54%). Size-exclusion chromatography (PS-equivalent), Mn 13,700; Mw 18,200; PDI 1.3. $^1$H NMR CDCl$_3$ 300 MHz: 7.00 (s, 1H), 3.45 (t, 1H), 2.83 (t, 2H), 1.90-1.20 (m, 8H), 0.94 (t, 1.5H).

Example A10

Preparation of Polymer 7 (50% of Grafting)

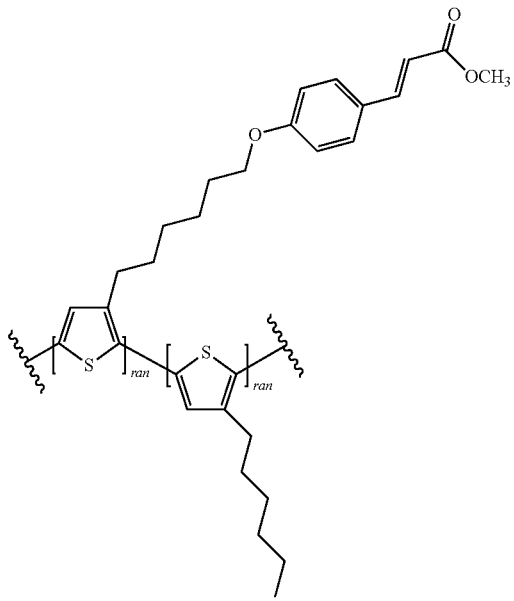

A mixture of polymer 6 (250 mg), (E)-4-(4-hydroxyphenyl)but-3-en-2-one (216 mg, 1.212 mmol), and K$_2$CO$_3$ (335 mg, 2.424 mmol) in a mixture of 15 ml of THF and 10 mL of DMF is stirred at 90° C. under Argon. After 12 h at 90° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford 272 mg of polymer 7 as dark purple crystal. Size-exclusion chromatography (PS-equivalent), Mn 16,000; Mw 21,700; PDI 1.3. $^1$H NMR CDCl$_3$ 300 MHz: 7.64 (d, 0.5H), 7.44 (d, 1H), 7.00 (s, 1H), 6.87 (d, 1H), 6.29 (d, 0.5H), 3.98 (t, 1H), 3.79 (s, 1.5H), 2.82 (t, 2H), 1.90-1.30 (m, 8H), 1.36 (t, 1.5H).

Example A11

Preparation of Polymer 8 (50% of Grafting)

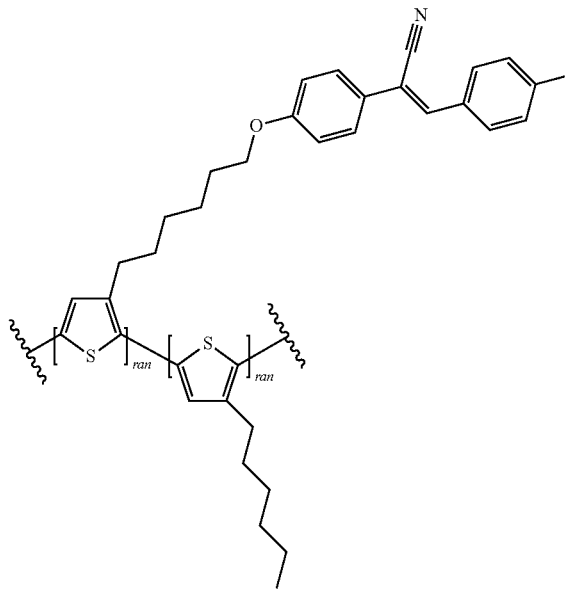

A mixture of polymer 6 (250 mg), (Z)-3-(4-fluorophenyl)-2-(4-hydroxyphenyl)prop-2-enenitrile (300 mg, 1.254 mmol), and K$_2$CO$_3$ (335 mg, 2.424 mmol) in a mixture of 15 ml of THF and 10 mL of DMF is stirred at 90° C. under Argon. After 12 h at 90° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford 286 mg of polymer 4 as dark purple crystal. Size-exclusion chromatography (PS-equivalent), Mn 19,600; Mw 30,200; PDI 1.5. $^1$H NMR CDCl$_3$ 300 MHz: 7.79 (d, 1H), 7.51 (d, 1H), 7.30 (s, 0.5H), 7.08 (d, 1H), 7.00 (s, 1H), 6.90 (d, 1H), 3.97 (t, 1H), 2.83 (t, 2H), 1.90-1.10 (m, 8H), 0.92 (t, 1.5H).

Example A12

Preparation of Polymer 9 (50% of Grafting)

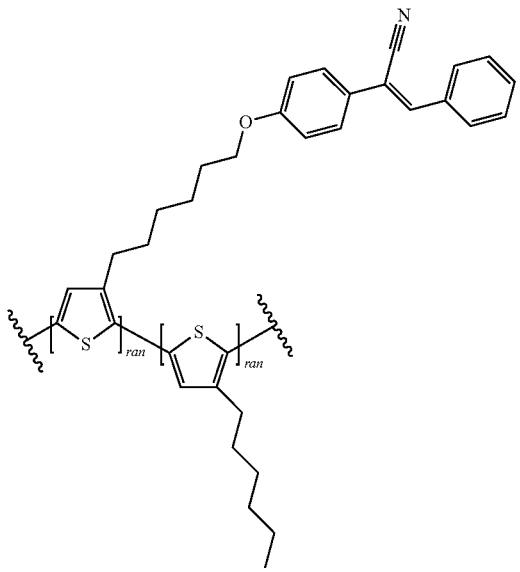

A mixture of polymer 6 (250 mg), (Z)-2-(4-hydroxyphenyl)-3-phenyl-prop-2-enenitrile (300 mg, 1.356 mmol), and K$_2$CO$_3$ (335 mg, 2.424 mmol) in a mixture of 15 ml of THF and 10 mL of DMF is stirred at 90° C. under Argon. After 12 h at 90° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford 226 mg of polymer 5 as dark purple crystal. Size-exclusion chromatography (PS-equivalent), Mn 18,400; Mw 30,500; PDI 1.6. $^1$H NMR CDCl$_3$ 300 MHz: 7.81 (d, 1H), 7.54 (d, 1H), 7.39 (m, 2H), 7.00 (s, 1H), 6.90 (d, 1H), 3.97 (t, 1H), 2.83 (t, 2H), 1.90-1.30 (m, 8H), 0.93 (t, 1.5H).

Example A13
Preparation of Polymer 10 (25% of Pre-grafting)

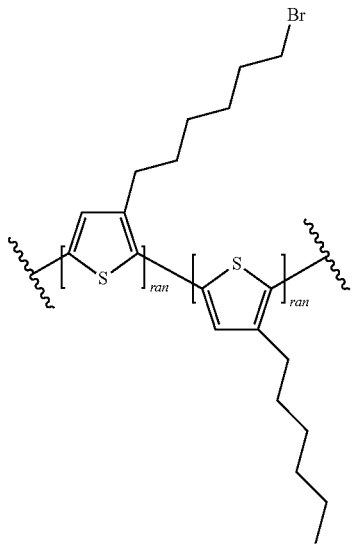

To a solution of 2,5-dibromo-3-(6-bromohexyl)thiophene (729 mg, 2.236 mmol) and 2,5-dibromo-3-hexyl-thiophene (2715 mg, 6.704 mmol) in 36 mL of THF is added dropwise 4.8 mL of isopropyl magnesium chloride (9.600 mmol, 2.0 M in THF) at −40° C. The reaction mixture is stirred at −40° C. for 1 h and a suspension of Ni(dppp)Cl$_2$ (48 mg, 0.091 mmol) in 10 mL of THF is added. The resulting red solution is warmed to room temperature. After 12 h of stirring at room temperature, the reaction mixture is poured in HCl 1N (100 mL) and extracted twice with CHCl$_3$. The organic layers are combined, washed with water, dry on MgSO$_4$, concentred and precipitated in cold MeOH. The filtrate is extracted by using Soxhlet with MeOH, Acetone and finally with CHCl$_3$. The CHCl$_3$ fraction is evaporated to dryness to afford polymer 10 as dark purple crystal (1419 mg). Size-exclusion chromatography (PS-equivalent), Mn 18,100; Mw 24,500; PDI 1.3. $^1$H NMR CDCl$_3$ 300 MHz: 7.00 (s, 1H), 3.45 (t, 1.5H), 2.83 (t, 2H), 1.90-1.20 (m, 8H), 0.94 (t, 0.75H).

Example A14
Preparation of Polymer 11 (25% of Grafting)

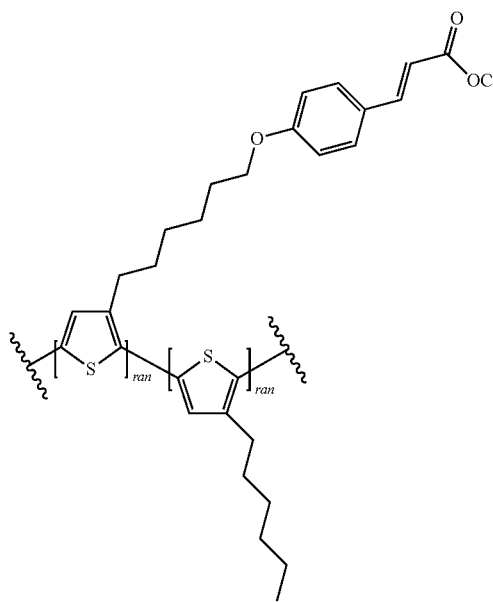

A mixture of polymer 10 (300 mg), (E)-4-(4-hydroxyphenyl)but-3-en-2-one (300 mg, 1.684 mmol), and K$_2$CO$_3$ (500 mg, 3.618 mmol) in a mixture of 30 ml of THF and 10 mL of DMF is stirred at 90° C. under Argon. After 12 h at 90° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford 272 mg of polymer 11 as dark purple crystal. Size-exclusion chromatography (PS-equivalent), Mn 18,300; Mw 22,700; PDI 1.2. $^1$H NMR CDCl$_3$ 300 MHz: 7.64 (d, 0.25H), 7.44 (d, 0.5H), 7.00 (s, 1H), 6.87 (d, 0.5H), 6.29 (d, 0.25H), 3.98 (t, 0.5H), 3.79 (s, 0.75H), 2.82 (t, 2H), 1.90-1.30 (m, 8H), 1.36 (t, 2.25H).

Example A15
Preparation of Polymer 12 (25% of Grafting)

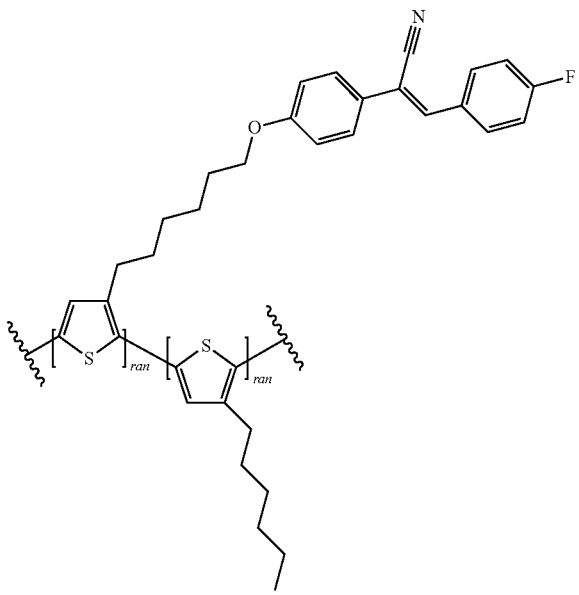

A mixture of polymer 10 (300 mg), (Z)-3-(4-fluorophenyl)-2-(4-hydroxyphenyl)prop-2-enenitrile (300 mg, 1.254 mmol), and K$_2$CO$_3$ (500 mg, 3.618 mmol) in a mixture of 25 ml of THF and 10 mL of DMF is stirred at 90° C. under Argon. After 12 h at 90° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford 319 mg of polymer 12 as dark purple crystal. H NMR CDCl$_3$ 300 MHz: 7.79 (d, 0.5H), 7.51 (d, 0.5H), 7.30 (s, 0.25H), 7.08 (d, 0.5H), 7.00 (s, 1H), 6.90 (d, 0.5H), 3.97 (t, 0.5H), 2.83 (t, 2H), 1.90-1.30 (m, 8H), 0.92 (t, 0.75).

Example A16

Preparation of Polymer 13 (25% of Grafting)

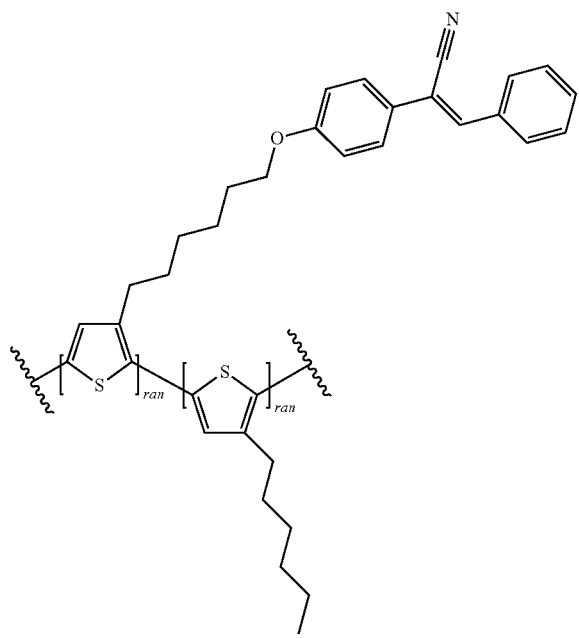

A mixture of polymer 10 (300 mg), (Z)-2-(4-hydroxyphenyl)-3-phenyl-prop-2-enenitrile (300 mg, 1.356 mmol), and $K_2CO_3$ (500 mg, 3.618 mmol) in a mixture of 25 ml of THF and 10 mL of DMF is stirred at 90° C. under Argon. After 12 h at 90° C., the reaction mixture is poured in HCl 1N and extracted twice with $CHCl_3$. The organic layers are combined, washed with HCl 1N, washed with $H_2O$, dried over anhydrous $MgSO_4$, concentrated and precipitated in cold MeOH. The filtrate is extracted by using Soxhlet with MeOH, Acetone and $CHCl_3$. The $CHCl_3$ fraction is evaporated to dryness to afford 150 mg of polymer 13 as dark purple crystal. $^1$H NMR $CDCl_3$ 300 MHz: 7.81 (d, 0.5H), 7.54 (d, 0.5H), 7.39 (m, 1H), 7.00 (s, 1H), 6.90 (d, 0.5H), 3.97 (t, 0.5H), 2.83 (t, 2H), 1.90-1.30 (m, 8H), 0.93 (t, 0.75).

Example A17

Preparation of Polymer 14 (75% of Pre-grafting)

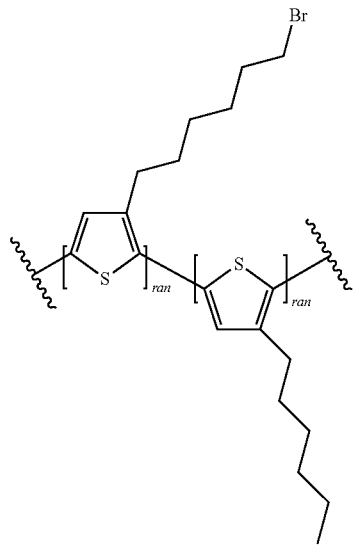

To a solution of 2,5-dibromo-3-(6-bromohexyl)thiophene (2186 mg, 6.704 mmol) and 2,5-dibromo-3-hexyl-thiophene (905 mg, 2.235 mmol) in 36 mL of THF is added dropwise 4.8 mL of isopropyl magnesium chloride (9.600 mmol, 2.0 M in THF) at −40° C. The reaction mixture is stirred at −40° C. for 1 h and a suspension of Ni(dppp)Cl$_2$ (48 mg, 0.091 mmol) in 10 mL of THF is added. The resulting red solution is warmed to room temperature. After 12 h of stirring at room temperature, the reaction mixture is poured in HCl 1N (100 mL) and extracted twice with $CHCl_3$. The organic layers are combined, washed with water, dry on $MgSO_4$, concentred and precipitated in cold MeOH. The filtrate is extracted by using Soxhlet with MeOH, Acetone and finally with $CHCl_3$. The $CHCl_3$ fraction is evaporated to dryness to afford polymer 6 as dark purple crystal (1419 mg). Size-exclusion chromatography (PS-equivalent), Mn 16,200; Mw 21,300; PDI 1.3. $^1$H NMR $CDCl_3$ 300 MHz: 7.00 (s, 1H), 3.45 (t, 0.5H), 2.83 (t, 2H), 1.90-1.20 (m, 8H), 0.94 (t, 2.25H)

Example A18

Preparation of Polymer 15 (75% of Grafting)

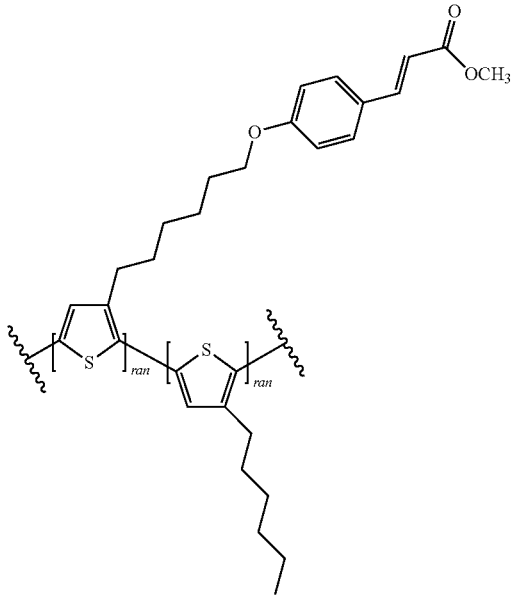

A mixture of polymer 14 (300 mg), (E)-4-(4-hydroxyphenyl)but-3-en-2-one (400 mg, 2.245 mmol), and $K_2CO_3$ (500 mg, 3.618 mmol) in a mixture of 17 ml of THF and 10 mL of DMF is stirred at 90° C. under Argon. After 12 h at 90° C., the reaction mixture is poured in HCl 1N and extracted twice with $CHCl_3$. The organic layers are combined, washed with HCl 1N, washed with $H_2O$, dried over anhydrous $MgSO_4$, concentrated and precipitated in cold MeOH. The filtrate is extracted by using Soxhlet with MeOH, Acetone and $CHCl_3$. The $CHCl_3$ fraction is evaporated to dryness to afford 354 mg of polymer 15 as dark purple crystal. Size-exclusion chromatography (PS-equivalent), Mn 21,500; Mw 28,900; PDI 1.3. $^1$H NMR $CDCl_3$ 300 MHz: 7.64 (d, 0.75H), 7.44 (d, 1.5H), 7.00 (s, 1H), 6.87 (d, 1.5H), 6.29 (d, 0.75H), 3.98 (t, 1.5H), 3.79 (s, 2.25H), 2.82 (t, 2H), 1.90-1.30 (m, 8H), 1.36 (t, 0.75H).

Example A19

Preparation of Polymer 16 (75% of Grafting)

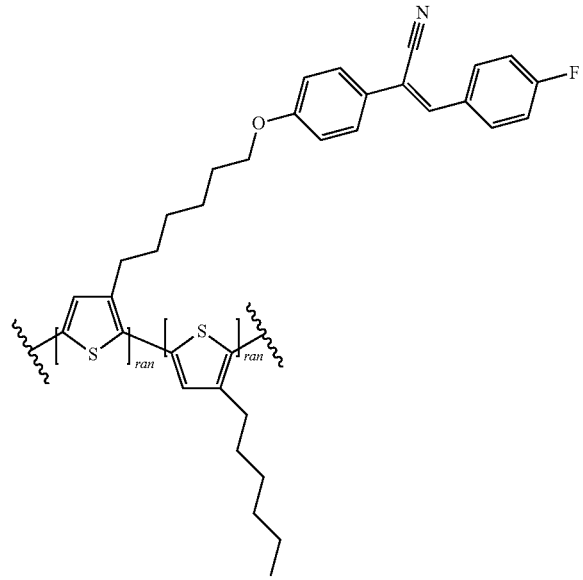

A mixture of polymer 14 (268 mg), (Z)-3-(4-fluorophenyl)-2-(4-hydroxyphenyl)prop-2-enenitrile (500 mg, 2.090 mmol), and $K_2CO_3$ (900 mg, 6.512 mmol) in a mixture of 15 ml of THF and 10 mL of DMF is stirred at 90° C. under Argon. After 12 h at 90° C., the reaction mixture is poured in HCl 1N and extracted twice with $CHCl_3$. The organic layers are combined, washed with HCl 1N, washed with $H_2O$, dried over anhydrous $MgSO_4$, concentrated and precipitated in cold MeOH. The filtrate is extracted by using Soxhlet with MeOH, Acetone and $CHCl_3$. The $CHCl_3$ fraction is evaporated to dryness to afford 363 mg of polymer 16 as dark purple crystal. $^1H$ NMR $CDCl_3$ 300 MHz: 7.79 (d, 1.5H), 7.51 (d, 1.5H), 7.30 (s, 0.75H), 7.08 (d, 1.5H), 7.00 (s, 1H), 6.90 (d, 1.5H), 3.97 (t, 1.5H), 2.83 (t, 2H), 1.90-1.30 (m, 8H), 0.92 (t, 0.75H).

Example A20

Preparation of Polymer 17 (75% of Grafting)

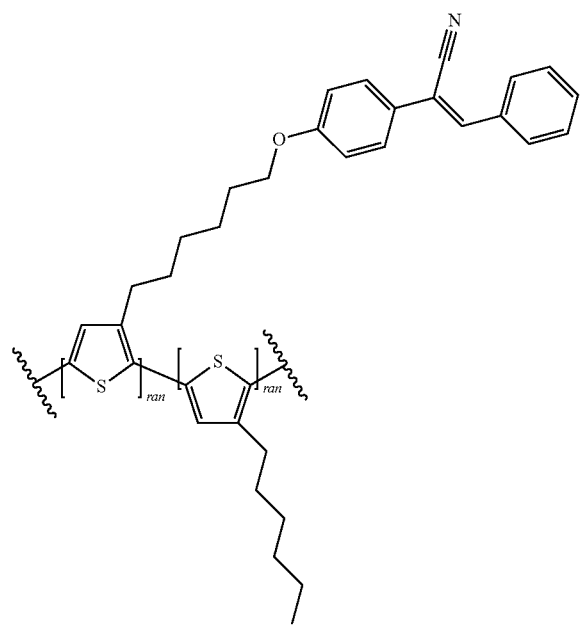

A mixture of polymer 14 (252 mg), (Z)-2-(4-hydroxyphenyl)-3-phenyl-prop-2-enenitrile (500 mg, 2.260 mmol), and K2CO3 (900 mg, 6.512 mmol) in a mixture of 15 ml of THF and 10 mL of DMF is stirred at 90° C. under Argon. After 12 h at 90° C., the reaction mixture is poured in HCl 1N and extracted twice with $CHCl_3$. The organic layers are combined, washed with HCl 1N, washed with $H_2O$, dried over anhydrous $MgSO_4$, concentrated and precipitated in cold MeOH. The filtrate is extracted by using Soxhlet with MeOH, Acetone and $CHCl_3$. The $CHCl_3$ fraction is evaporated to dryness to afford 328 mg of polymer 17 as dark purple crystal. $^1H$ NMR $CDCl_3$ 300 MHz: 7.81 (d, 1.5H), 7.54 (d, 1.5H), 7.39 (m, 3H), 7.00 (s, 1H), 6.90 (d, 1.5H), 3.97 (t, 1.5H), 2.83 (t, 2H), 1.90-1.30 (m, 8H), 0.93 (t, 0.75).

Example A21

Preparation of Polymer 18 (50% of Pre-grafting)

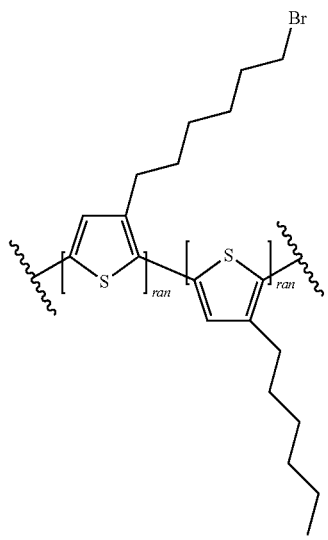

To a solution of 2,5-dibromo-3-hexyl-thiophene (459 mg, 1.4 mmol) in 14 mL of THF is added dropwise 0.7 mL of isopropyl magnesium chloride (1.4 mmol, 2.0 M in THF) at −40° C. The reaction mixture 1 is stirred at 0° C. for 1 h and a suspension of $Ni(dppp)Cl_2$ (24 mg, 0.0443 mmol) in 1.5 mL of THF is added. The resulting red solution is warmed to room temperature. In parallel, to a solution of 2,5-dibromo-3-(6-bromohexyl)thiophene (570 mg, 1.4 mmol) in 14 mL of THF is added dropwise 0.7 mL of isopropyl magnesium chloride (1.4 mmol, 2.0 M in THF) at −40° C. The reaction mixture 2 is stirred at 0° C. for 1 h and is added to the reaction mixture 1 at room temperature. The resulting red solution is warmed to room temperature. After 12 h of stirring at room temperature, the reaction mixture is poured in HCl 1N. The precipitated product is filtered off, dissolved in $CHCl_3$, and precipitated in cold MeOH. The precipitated product is filtered off and is extracted by using Soxhlet with MeOH, Acetone and $CHCl_3$. The $CHCl_3$ fraction is evaporated to dryness to afford 248 mg of polymer 18 as dark purple crystal. Size-exclusion chromatography (PS-equivalent), Mn 11,800; Mw 15,660; PDI 1.32. $^1H$ NMR $CDCl_3$ 300 MHz: 7.00 (s, 1H), 3.45 (t, 1H), 2.83 (t, 2H), 1.90-1.20 (m, 8H), 0.94 (t, 1.5H)

Example A22

Preparation of Polymer 19 (block-50% of Grafting)

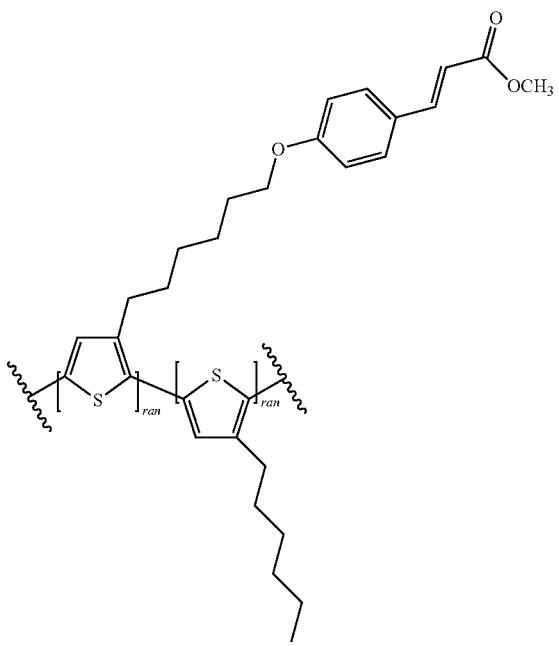

A mixture of polymer 18 (266 mg), (E)-4-(4-hydroxyphenyl)but-3-en-2-one (216 mg, 1.212 mmol), and $K_2CO_3$ (335 mg, 2.424 mmol) in a mixture of 10 ml of THF and 10 mL of DMF is stirred at 80° C. under Argon. After 12 h at 80° C., the reaction mixture is poured in HCl 1N. The precipitated product is filtered off, dissolved in $CHCl_3$, and precipitated in cold MeOH. The precipitated product is filtered off and is extracted by using Soxhlet with MeOH, Acetone and $CHCl_3$. The $CHCl_3$ fraction is evaporated to dryness to afford 248 mg of polymer 19 as dark purple crystal. Size-exclusion chromatography (PS-equivalent), Mn 10,790; Mw 13,390; PDI 1.24. $^1$H NMR $CDCl_3$ 300 MHz: 7.64 (d, 0.5H), 7.44 (d, 1H), 7.00 (s, 1H), 6.87 (d, 1H), 6.29 (d, 0.5H), 3.98 (t, 1H), 3.79 (s, 1.5H), 2.82 (t, 2H), 1.90-1.30 (m, 8H), 1.36 (t, 1.5H).

Example A23

Preparation of Polymer 20 (100% of Pre-grafting; DP50)

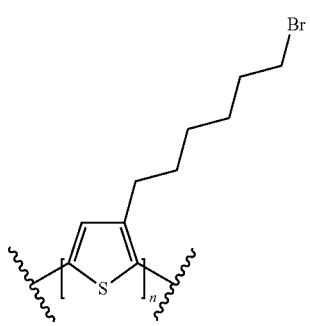

To a solution of 2,5-dibromo-3-(6-bromohexyl)thiophene (10 g, 24.7 mmol) in 120 mL of THF is added dropwise 2.4 mL of isopropyl magnesium chloride (26.4 mmol, 2.0 M in THF) at −40° C. The reaction mixture is stirred at −40° C. for 1 h and a suspension of Ni(dppp)Cl$_2$ (261 mg, 0.49 mmol) in 30 mL of THF is added. The resulting red solution is warmed to room temperature. After 12 h of stirring at room temperature, the reaction mixture is poured in HCl 1N (100 mL) and extracted twice with $CHCl_3$. The organic layers are combined, washed with water, dry on MgSO4, concentred and precipitated in cold MeOH. The filtrate is extracted by using Soxhlet with MeOH, Acetone and finally with $CHCl_3$. The $CHCl_3$ fraction is evaporated to dryness to afford polymer 20 as dark purple crystal (4.8 g, 48%). Size-exclusion chromatography (PS-equivalent), Mn 15,300; Mw 19,800; PDI 1.29. $^1$H NMR $CDCl_3$ 300 MHz: 7.97 (s, 1H), 3.42 (t, 2H), 2.82 (t, 2H), 1.90-1.30 (m, 8H).

Example A23

Preparation of Polymer 21 (100% of Grafting, DP50)

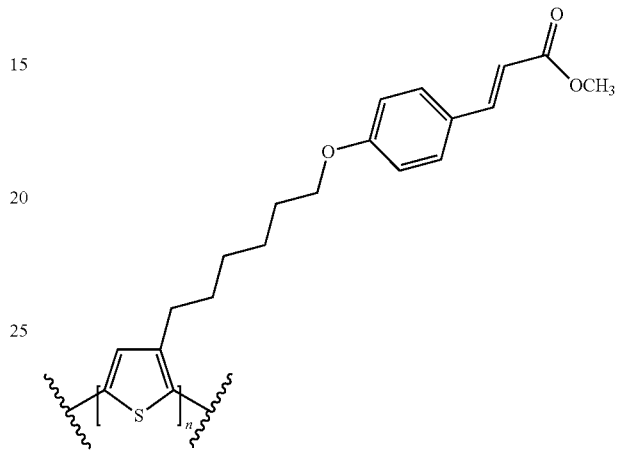

A mixture of polymer 20 (350 mg), (E)-4-(4-hydroxyphenyl)but-3-en-2-one (382 mg, 2.1 mmol), and $K_2CO_3$ (592 mg, 4.3 mmol) in a mixture of 10 ml of THF and 10 mL of DMF is stirred at 80° C. under Argon. After 12 h at 110° C., the reaction mixture is poured in HCl 1N and extracted twice with $CHCl_3$. The organic layers are combined, washed with HCl 1N, washed with $H_2O$, dried over anhydrous $MgSO_4$, concentrated and precipitated in cold MeOH. The filtrate is extracted by using Soxhlet with MeOH, Acetone and $CHCl_3$. The $CHCl_3$ fraction is evaporated to dryness to afford polymer 21 as dark purple crystal (90%). Size-exclusion chromatography (PS-equivalent), Mn 18,000; Mw 24,780; PDI 1.37. $^1$H NMR $CDCl_3$ 300 MHz: 7.62 (d, 1H), 7.42 (d, 2H), 7.00 (s 1H), 6.85 (d, 2H), 6.27 (d, 1H), 3.95 (t, 2H), 3.78 (s, 3H), 2.83 (t, 2H), 1.90-1.30 (m, 8H).

Example A24

Preparation of Polymer 22 (100% of Grafting, DP50)

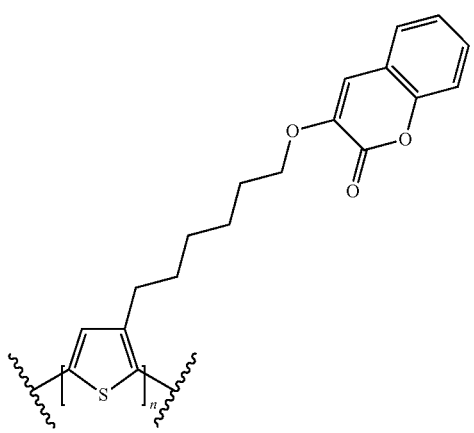

A mixture of polymer 20 (100 mg), (6-hydroxycoumarin (99 mg, 0.61 mmol), and K$_2$CO$_3$ (169 mg, 1.22 mmol) in a mixture of 3 ml of THF and 3 mL of DMF is stirred at 80° C. under Argon. After 12 h at 110° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford polymer 22 as dark purple crystal (65%). Size-exclusion chromatography could not be providing due to the low solubility of the material in THF. $^1$H NMR CDCl$_3$ 300 MHz: 7.4-7.1 (m, 4H), 6.99 (s, 1H), 6.82 (s, 1H), 4.01 (t, 2H), 2.83 (t, 2H), 1.90-1.30 (m, 8H).

Example A25

Preparation of Polymer 23 (100% of Grafting, DP50)

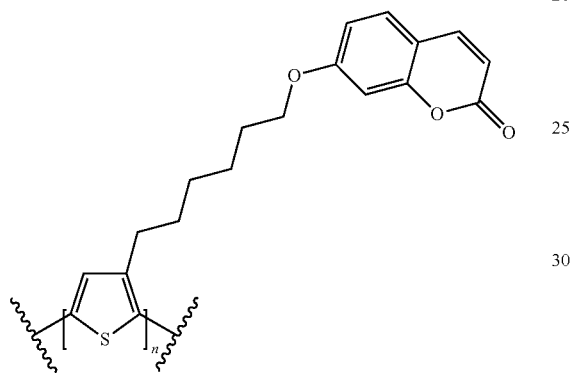

A mixture of polymer 20 (100 mg), (6-hydroxycoumarin (99 mg, 0.61 mmol), and K$_2$CO$_3$ (169 mg, 1.22 mmol) in a mixture of 3 ml of THF and 3 mL of DMF is stirred at 80° C. under Argon. After 12 h at 110° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford polymer 23 as dark purple crystal (55%). Size-exclusion chromatography could not be providing due to the low solubility of the material in THF. $^1$H NMR CDCl$_3$ 300 MHz: 7.57 (d, 1H), 7.19 (d, 1H), 7.05 (dd, 1H), 6.99 (s, 1H), 6.86 (d, 1H), 6.36 (d, 1H), 3.95 (t, 2H), 2.82 (t, 2H), 1.90-1.30 (m, 8H).

Example A26

Preparation of Polymer 24 (100% of Pre-grafting; DP200)

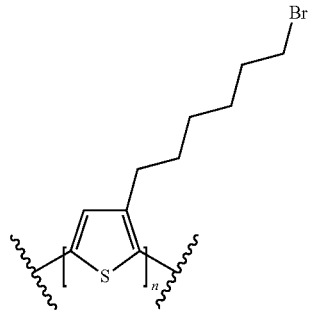

To a solution of 2,5-dibromo-3-(6-bromohexyl)thiophene (3.6 g, 8.8 mmol) in 36 mL of THF is added dropwise 4.8 mL of isopropyl magnesium chloride (9.6 mmol, 2.0 M in THF) at −40° C. The reaction mixture is stirred at −40° C. for 1 h and a suspension of Ni(dppp)Cl$_2$ (24 mg, 0.045 mmol) in 10 mL of THF is added. The resulting red solution is warmed to room temperature. After 12 h of stirring at room temperature, the reaction mixture is poured in HCl 1N (100 mL) and extracted twice with CHCl$_3$. The organic layers are combined, washed with water, dry on MgSO4, concentred and precipitated in cold MeOH. The filtrate is extracted by using Soxhlet with MeOH, Acetone and finally with CHCl$_3$. The CHCl$_3$ fraction is evaporated to dryness to afford polymer 24 as dark purple crystal (1.5 g, 45%). Size-exclusion chromatography (PS-equivalent), Mn 27,300; Mw 56,800; PDI 2.1. $^1$H NMR CDCl$_3$ 300 MHz: 7.97 (s, 1H), 3.42 (t, 2H), 2.82 (t, 2H), 1.90-1.30 (m, 8H).

Example A27

Preparation of Polymer 25 (100% of Grafting, DP200)

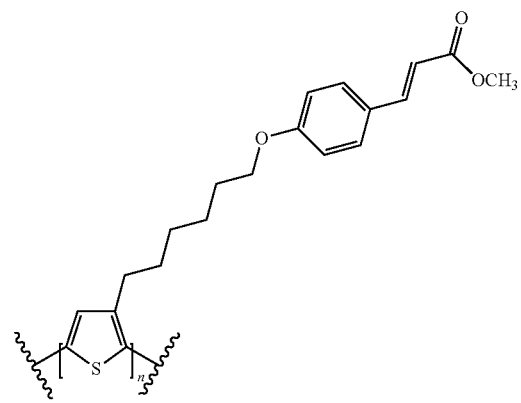

A mixture of polymer 24 (350 mg), (E)-4-(4-hydroxyphenyl)but-3-en-2-one (382 mg, 2.1 mmol), and K$_2$CO$_3$ (592 mg, 4.3 mmol) in a mixture of 10 ml of THF and 10 mL of DMF is stirred at 80° C. under Argon. After 12 h at 110° C., the reaction mixture is poured in HCl 1N and extracted twice with CHCl$_3$. The organic layers are combined, washed with HCl 1N, washed with H$_2$O, dried over anhydrous MgSO$_4$, concentrated and precipitated in cold MeOH. The filtrate is extracted by using Soxhlet with MeOH, Acetone and CHCl$_3$. The CHCl$_3$ fraction is evaporated to dryness to afford polymer 25 as dark purple crystal (90%). Size-exclusion chromatography (PS-equivalent), Mn 30,100; Mw 65,280; PDI 2.1. $^1$H NMR CDCl$_3$ 300 MHz: 7.62 (d, 1H), 7.42 (d, 2H), 7.00 (s 1H), 6.85 (d, 2H), 6.27 (d, 1H), 3.95 (t, 2H), 3.78 (s, 3H), 2.83 (t, 2H), 1.90-1.30 (m, 8H).

Example A28

Preparation of 3-(8-bromooctyl)thiophene

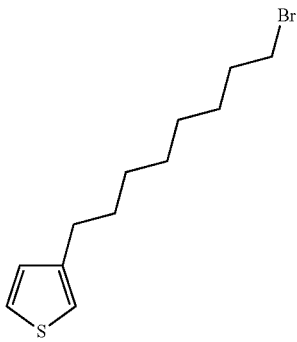 [SMILES: BrCCCCCCCCc1ccsc1]

3-Bromothiophene (10.00 g, 61.3 mmol) is dissolved in 85 mL of hexane under argon. The solution is cooled down at −50° C. and the solution stirred for 10 minutes. n-BuLi 2.5 M in hexane (31.9 mL, 79.900 mmol) is added dropwise. 8 mL of THF is added to the pale yellow solution and the reacting mixture is stirred for 1 h. 1,8-Dibromooctane (45.2 mL, 245.0 mmol) is added in one portion at −10° C. and the mixture is warmed to room temperature and stirred for 12 h. The reaction is quenched by pouring 75 mL of water into the flask and extracted twice with ethylacetate The organic layer is washed with water, dried over anhydrous $MgSO_4$ and evaporated to dryness. The resulting pale yellow oil is purified by distillation and column chromatography ($SiO_2$, Heptane) to yield colourless oil (5.9 g, 35%). $^1$H NMR DMSO-$D_6$ 300 MHz: 7.43 (dd, 1H), 7.12 (d, 1H), 6.98 (dd, 1H), 3.52 (t, 2H), 2.50 (t, 2H), 1.65-1.10 (m, 14H).

Example A29

Preparation of 2,5-dibromo-3-(8-bromooctyl)thiophene

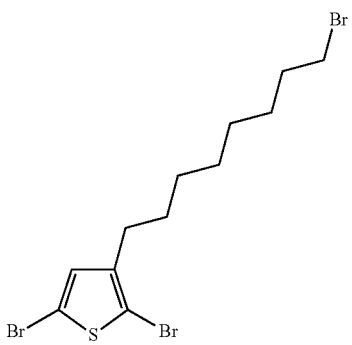 [SMILES: BrCCCCCCCCc1cc(Br)sc1Br]

3-(8-bromooctyl)thiophene (4.40 g, 16.0 mmol) is dissolved in 125 mL of dimethylformamide under argon. N-Bromosuccinimide (6.0 g, 33.6 mmol) in 50 mL of DMF is added dropwise to the clear solution at −20° C. The reaction mixture is stirred at room temperature for 12 h and is poured into cold water (50 mL). The organic layer is extracted three times dichloromethane. The organic layers are combined and washed with HCl 1N (3×30 mL), dried over anhydrous MgSO4 and concentrated under reduced pressure. The crude product is purified on column chromatography ($SiO_2$, Heptane) to afford 2,5-dibromo-3-(6-bromooctyl)thiophene (3.9 g, 56%). $^1$H NMR DMSO-$D_6$ 300 MHz: 7.14 (s, 1H), 3.52 (t, 2H), 2.50 (t, 2H), 1.65-1.10 (m, 14H).

Example A30

Preparation of (E)-4-[4-[8-(2,5-dibromo-3-thienyl)octyloxy]phenyl]but-3-en-2-one

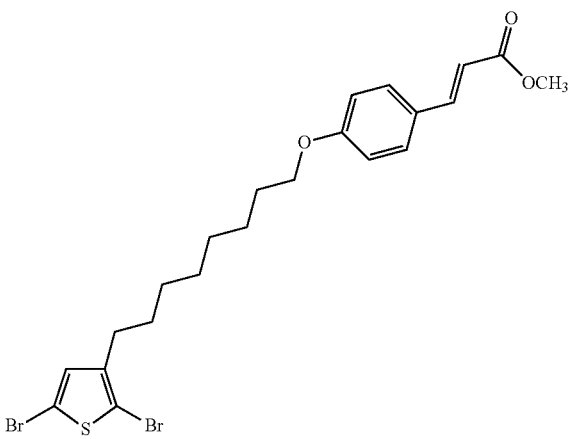 [SMILES: COC(=O)/C=C/c1ccc(OCCCCCCCCc2cc(Br)sc2Br)cc1]

A mixture of 2,5-dibromo-3-(8-bromooctyl)thiophene (3.0 g, 6.0 mmol), (E)-4-(4-hydroxyphenyl)but-3-en-2-one (1.2 g, 6.0 mmol), and $K_2CO_3$ (1.9 g, 13.9 mmol) in 75 mL of dimethylformamide is stirred at 80° C. under Argon. After 12 h at 80° C., the reaction mixture is poured in HCl 1N and extracted twice with AcOEt. The organic layers are combined, washed with HCl 1N, washed with H2O, dried over anhydrous MgSO4 and evaporated to dryness. The crude product is purified on column chromatography ($SiO_2$, 15/85: AcOEt/Heptane) to afford (E)-4-[4-[8-(2,5-dibromo-3-thienyl)octyloxy]phenyl]but-3-en-2-one (3.17 g, 88%). $^1$H NMR DMSO-$D_6$ 300 MHz:: 7.67 (d, 1H),7.48 (d, 2H), 6.90 (d, 2H), 6.79 8s, 1H), 6.33 (d, 1H), 4.00 (t, 2H), 3.81 (s, 3H), 2.54 (t, 2H), 1.82 (t, 2H), 1.65-1.35 (m, 10H).

Example A31

Preparation of Polymer 26

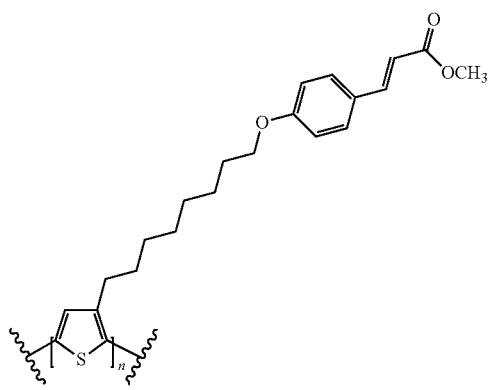

To a solution of (E)-4-[4-[8-(2,5-dibromo-3-thienyl)octyloxy]phenyl]but-3-en-2-one (1310 mg, 2.550 mmol), in 10 mL of THF is added dropwise 1.35 mL of isopropyl magnesium chloride (2.70 mmol, 2.0 M in THF) at −40° C. The reaction mixture is stirred at −40° C. for 1 h and a suspension of Ni(dppp)Cl$_2$ (13.5 mg, 0.0256 mmol) in 3 mL of THF is added. The resulting red solution is warmed to room temperature. After 12 h of stirring at room temperature, the reaction mixture is poured in HCl 1N (100 mL) and extracted twice with CHCl$_3$. The organic layers are combined, washed with water, dry on MgSO4, concentred and precipitated in cold MeOH. The filtrate is extracted by using Soxhlet with MeOH, Heptane, Acetone and finally with CHCl$_3$. The CHCl$_3$ fraction is evaporated to dryness to afford polymer 26 as dark purple crystal (575 mg, 63%). $^1$H NMR CDCl$_3$ 300 MHz: 7.62 (d, 1H), 7.42 (d, 2H), 7.00 (s 1H), 6.85 (d, 2H), 6.27 (d, 1H), 3.95 (t, 2H), 3.78 (s, 3H), 2.83 (t, 2H), 1.90-1.30 (m, 12H).

Example A32

Preparation of Polymer 27

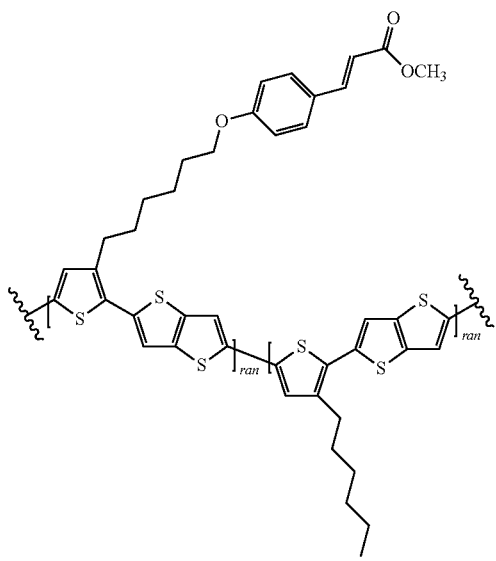

A solution of 2,5-dibromo-3-(6-bromohexyl)thiophene (82 mg, 0.25 mmol), (E)-4-[4-[6-(2,5-dibromo-3-thienyl)hexyloxy]phenyl]but-3-en-2-one (126 mg, 0.25 mmol), 2,5-Bis(trimethylstannyl)-thieno[3,2-b]thiophene (233 mg, 0.50 mmol) and tetrakis(triphenylphosphine)palladium(0) (12 mg, 0.01 mmol) in 40 mL of NMP is stirred at 95° C. under Argon. After 2 h at 95° C., the reaction mixture is poured in HCl 1N and the precipitated is filtered off. The filtrate is extracted by using Soxhlet with MeOH, Acetone and finally with CHCl$_3$. The CHCl$_3$ fraction is evaporated to dryness to afford to afford polymer 27 as dark black crystal (82 mg, 43%). $^1$H NMR CDCl$_3$ 300 MHz: 7.65 (d, 0.5H), 7.44 (m, 1H), 7.20 (m, 2H), 7.00 (sb, 1H), 6.87 (m, 1H), 6.29 (d, 0.5H), 3.98 (bs 1H), 3.79 (bs, 1.5H), 2.82 (t, 2H), 1.90-1.30 (m, 8H), 1.36 (t, 1.5H).

Example A33

Preparation of (Z)-2-[4-[6-(2,5-dibromo-3-thienyl)hexoxy]phenyl]-3-(4-fluorophenyl)prop-2-enenitrile

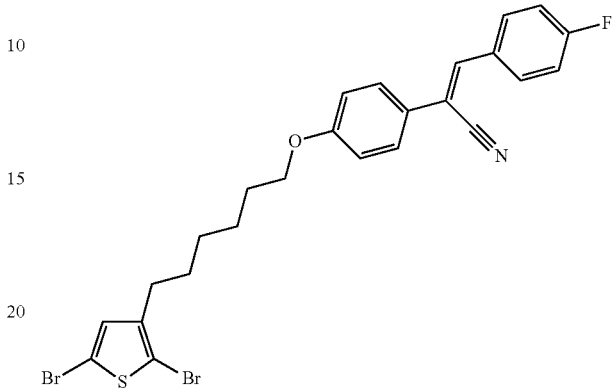

A mixture of 2,5-dibromo-3-(8-bromooctyl)thiophene 1.97 g, 4.85 mmol), (Z)-3-(4-fluorophenyl)-2-(4-hydroxyphenyl)prop-2-enenitrile (1.2 g, 5.0 mmol), and K$_2$CO$_3$ (4.0 g, 28.94 mmol) in 50 mL of dimethylformamide is stirred at 100° C. under Argon. After 12 h at 100° C., the reaction mixture is poured in HCl 1N and extracted twice with AcOEt. The organic layers are combined, washed with HCl 1N, washed with H2O, dried over anhydrous MgSO4 and evaporated to dryness. The crude product is purified on column chromatography (SiO$_2$, 10/90: AcOEt/Heptane) to afford (Z)-2-[4-[6-(2,5-dibromo-3-thienyl)hexoxy]phenyl]-3-(4-fluorophenyl)prop-2-enenitrile (2.3 g, 85%).

Example A34

Preparation of Polymer 28

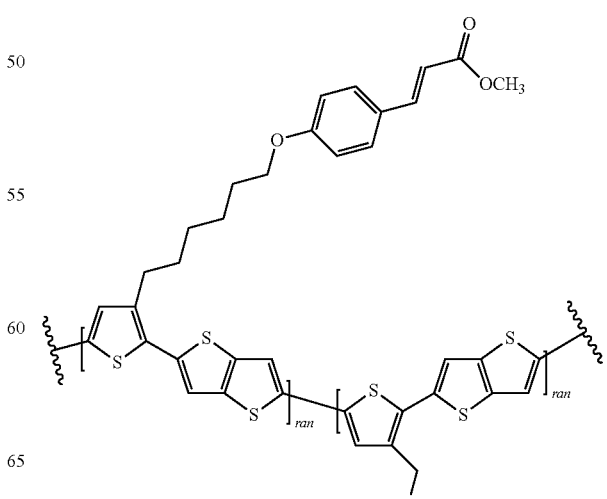

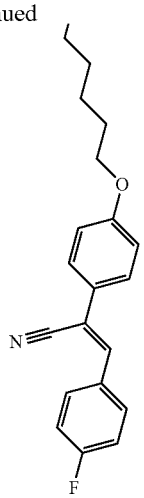

A solution of (Z)-2-[4-[6-(2,5-dibromo-3-thienyl)hexoxy]phenyl]-3-(4-fluorophenyl)prop-2-enenitrile (141 mg, 0.25 mmol), (E)-4-[4-[6-(2,5-dibromo-3-thienyl)hexyloxy]phenyl]but-3-en-2-one (126 mg, 0.25 mmol), 2,5-Bis(trimethylstannyl)-thieno[3,2-b]thiophene (233 mg, 0.50 mmol) and tetrakis(triphenylphosphine)palladium(0) (12 mg, 0.01 mmol) in 40 mL of NMP is stirred at 95° C. under Argon. After 2 h at 95° C., the reaction mixture is poured in HCl 1N and the precipitated is filtered off. The filtrate is extracted by using Soxhlet with MeOH, Acetone and finally with $CHCl_3$. The $CHCl_3$ fraction is evaporated to dryness to afford to afford polymer 28 as dark purple crystal (83 mg, 34%). $^1$H NMR $CDCl_3$ 300 MHz: 7.8 (m, 1H), 7.62 (m, 0.5H), 7.51 (m, 1H), 7.42 (m, 1H), 7.30 (sb, 0.5H), 7.20 (m, 2H), 7.08 (d, 1H), 7.00 (s, 1H), 6.90-6.85 (m, 2H), 6.27 (m, 0.5H), 3.97 (t, 2H), 3.78 (s, 1.5H), 2.83 (t, 2H), 1.90-1.10 (m, 8H), Example A35

Preparation of Polymer 29

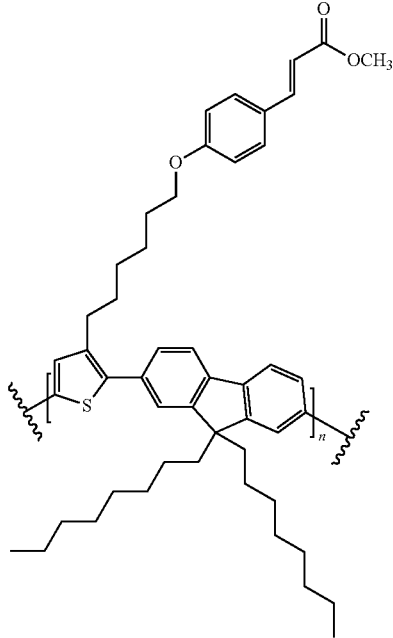

A solution of 2,5-dibromo-3-(6-bromohexyl)thiophene (450 mg, 0.90 mmol), 9,9-Dioctylfluorene-2,7-diboronic acid (500 mg, 0.9 mmol), tetrakis(triphenylphosphine)palladium(0) (52 mg, 0.045 mmol), $K_2CO_3$ (500 mg, 3.6 mmol) and tetrabuthylbromide (5 mg, cat) in 40 mL of Toluene is stirred at 90° C. under Argon. After 18 h at 90° C., 5 the reaction mixture is poured into cold water. The resulting mixture is extracted twice with toluene. The organic layers are combined and washed twice with water, dried over anhydrous MgSO4 and evaporated to dryness. The crude is dissolved in CHCl3 and precipitated in methanol. The precipitated is filtered off, washed with methanol and dryed to afford polymer 29 as greenish-yellow crystal (557 mg, 87%). $^1$H NMR $CDCl_3$ 300 MHz: 7.8-7.5 (m, 4H), 7.66 (d, 1H),7.5-7.3 (m, 2H), 7.46 (d, 2H), 7.34 (s 1H), 6.88 (d, 2H), 6.32 (d, 1H), 3.97 (t, 2H), 3.80(s, 3H), 2.80 (m, 2H), 2.06 (m, 4H), 1.79 (m, 4H), 1.49 (m, 4H), 1.11 (m, 20H), 0.83 (t, 6H), 0.80 (m, 4H).

Example A36

Preparation of (E)-4-[4-(8-bromooctoxy)phenyl]but-3-en-2-one

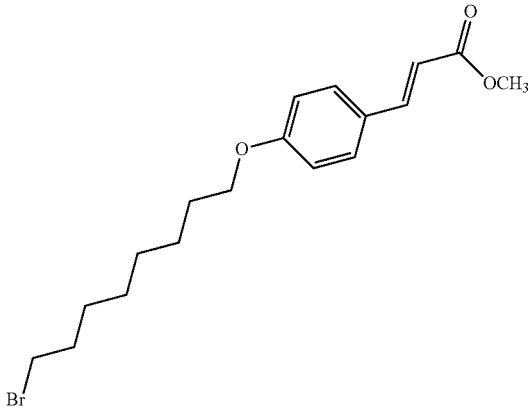 [SMILES: COC(=O)/C=C/c1ccc(OCCCCCCCCBr)cc1]

A mixture of (E)-4-(4-hydroxyphenyl)but-3-en-2-one (8.2 g, 46.0 mmol), 1,8-dibromooctane (25 g, 92 mmol), and $K_2CO_3$ (12.7 g, 92 mmol) in 250 mL of dimethylformamide is stirred at 80° C. under Argon. After 12 h at 80° C., the reaction mixture is poured in HCl 1N and extracted twice with AcOEt. The organic layers are combined, washed with HCl 1N, washed with $H_2O$, dried over anhydrous $Na_2SO_4$ and evaporated to dryness. The crude product is purified on column chromatography ($SiO_2$, Toluene) to afford ((E)-4-[4-(8-bromooctoxy)phenyl]but-3-en-2-one (15 g, 88%).

Example A37

Preparation of 2,5-bis[8-[4-[(E)-3-oxobut-1-enyl]phenoxy]octyl]-1,4-bis(2-thienyl)pyrrolo[3,4-c]pyrrole-3,6-dione

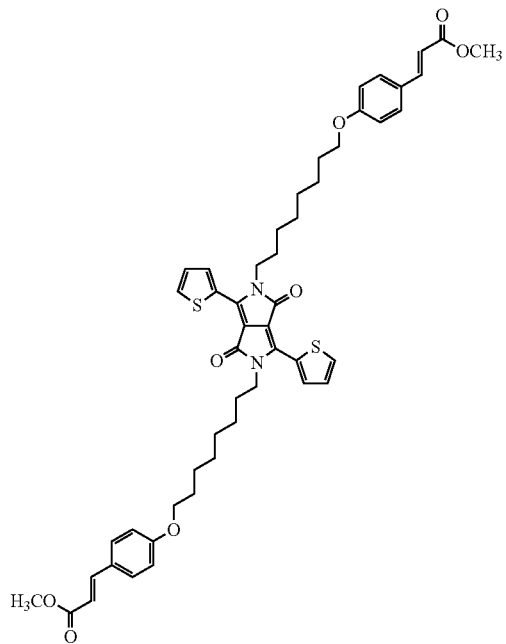 [SMILES: COC(=O)/C=C/c1ccc(OCCCCCCCCN2C(=O)C3=C(c4cccs4)N(CCCCCCCCOc4ccc(/C=C/C(=O)OC)cc4)C(=O)C3=C2c2cccs2)cc1]

A mixture of (E)-4-[4-(8-bromooctoxy)phenyl]but-3-en-2-one (3.4 g, 9.2 mmol), 1,4-bis(2-thienyl)-2,5-dihydropyrrolo[3,4-c]pyrrole-3,6-dione (1.38 g, 4.6 mmol), and $K_2CO_3$ (1.3 mg, 9.3 mmol) in 50 mL of dimethylformamide is stirred at 80° C. under Argon. After 12 h at 110° C., the reaction mixture is poured in cold water. The precipitated is filtered off and wash several times with water and methanol. The crude product is purified on column chromatography ($SiO_2$, 5/95: AcOEt/$CH_2Cl_2$) to afford 2,5-bis[8-[4-[(E)-3-oxobut-1-enyl]phenoxy]octyl]-1,4-bis(2-thienyl)pyrrolo[3,4-c]pyrrole-3,6-dione (800 mg, 21%). $^1$H NMR $CDCl_3$ 300 MHz: 8.95 (dd, 2H), 7.66 (d, 2H), 7.65(d; 2H), 7.47 (dd, 4H), 7.30 (m, 4H), 6.89 (dd, 4H), 6.32 (d, 2H), 4.09 (t, 4H), 3.98 (t, 4H), 3.81 (s, 6H), 1.78 (m, 8H), 1.65-1.30 (m, 16H).

Example A38

Preparation of (E)-4-[4-[8-[2,7-dibromo-9-[8-[4-[(E)-3-oxobut-1-enyl]phenoxy]octyl]fluoren-9-yl]octoxy]phenyl]but-3-en-2-one

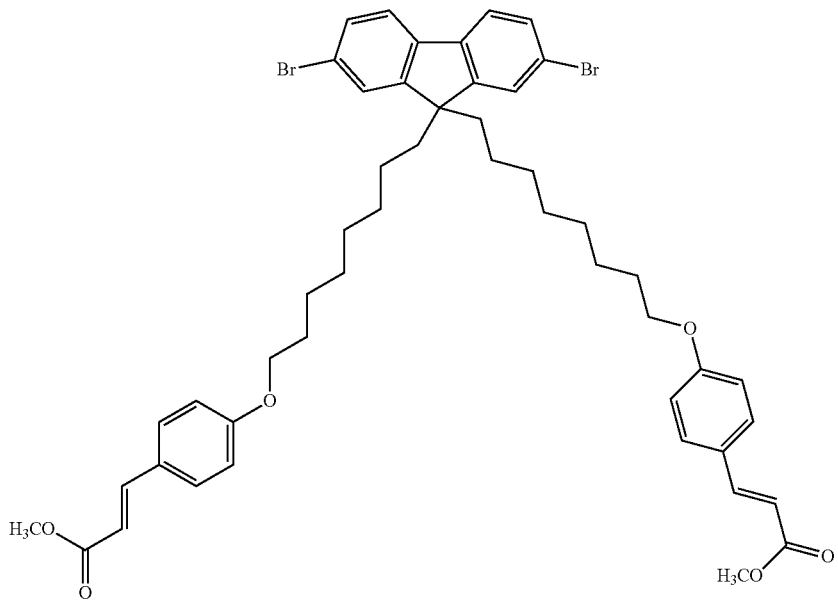 [SMILES: COC(=O)/C=C/c1ccc(OCCCCCCCCC2(CCCCCCCCOc3ccc(/C=C/C(=O)OC)cc3)c3cc(Br)ccc3-c3ccc(Br)cc32)cc1]

A mixture of 2,7-dibromo-9H-fluorene (2.0 g, 6.17 mmol), and NaH (360 mg, 15.00 mmol) in 35 mL of dimethylformamide is stirred at room temperature under Argon. After 1 h at RT, ((E)-4-[4-(8-bromooctoxy)phenyl]but-3-en-2-one (5.2 g, 13.9 mmol) is addeded by portion and the reaction mixture is stirred for aditionnal 12 h. The reaction mixture is poured in HCl 1N and extracted twice with AcOEt. The organic layers are combined, washed with HCl 1N, washed with H₂O, dried over anhydrous Na₂SO₄ and evaporated to dryness. The crude product is purified on column chromatography (SiO₂, Toluene) to afford (E)-4-[4-[8-[2,7-dibromo-9-[8-[4-[(E)-3-oxobut-1-enyl]phenoxy]octyl]fluoren-9-yl]octoxy]phenyl]but-3-en-2-one (2.7 g, 44%).

Example A39

Preparation of (E)-4-[4-[8-(2,7-dibromo-9H-fluoren-9-yl)octoxy]phenyl]but-3-en-2-one

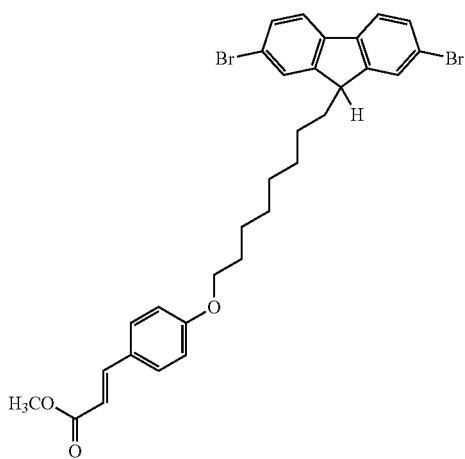 [SMILES: COC(=O)/C=C/c1ccc(OCCCCCCCCC2c3cc(Br)ccc3-c3ccc(Br)cc32)cc1]

A mixture of 2,7-dibromo-9H-fluorene (2.0 g, 6.17 mmol), and NaH (180 mg, 7.50 mmol) in 35 mL of dimethylformamide is stirred at room temperature under Argon. After 1 h at RT, ((E)-4-[4-(8-bromooctoxy)phenyl]but-3-en-2-one (2.4 g, 6.5 mmol) is addeded by portion and the reaction mixture is stirred for aditionnal 12 h. The reaction mixture is poured in HCl 1N and extracted twice with AcOEt. The organic layers are combined, washed with HCl 1N, washed with H₂O, dried over anhydrous Na₂SO₄ and evaporated to dryness. The crude product is purified on column chromatography (SiO₂, Toluene) to afford (E)-4-[4-[8-[2,7-dibromo-9-[8-[4-[(E)-3-oxobut-1-enyl]phenoxy]octyl]fluoren-9-yl]octoxy]phenyl]but-3-en-2-one (1.4 g, 37%).

B) Synthesis Examples of n- and Ambipolar Types Polymers

Example B1

Preparation of Polymer 30

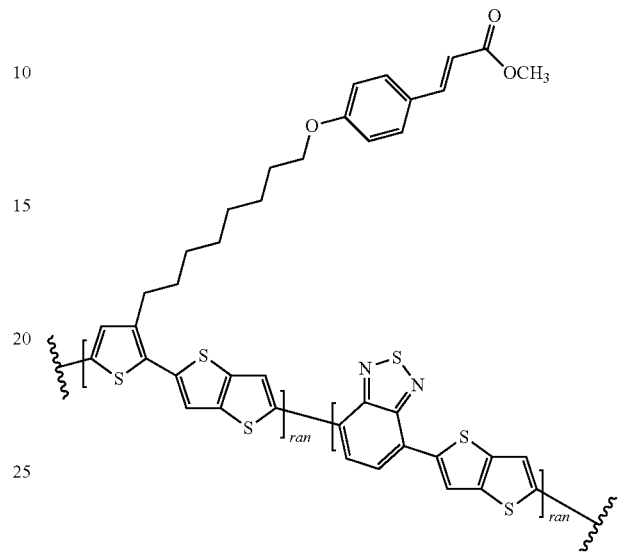

A solution of 4,7-Dibromo-2,1,3-benzothiadiazole (37 mg, 0.125 mmol), (E)-4-[4-[8-(2,5-dibromo-3-thienyl)octyloxy]phenyl]but-3-en-2-one (200 mg, 0.375 mmol), 2,5-Bis(trimethylstannyl)-thieno[3,2-b]thiophene (233 mg, 0.50 mmol) and tetrakis(triphenylphosphine)palladium(0) (12 mg, 0.01 mmol) in 40 mL of NMP is stirred at 95° C. under Argon. After 2 h at 95° C., the reaction mixture is poured in HCl 1N and the precipitated is filtered off. The filtrate is extracted by using Soxhlet with MeOH, Acetone and finally with CHCl₃. The CHCl₃ fraction is evapored to dryness to. The precipitated is filtered of and dried to afford polymer 30 as dark black powder (114 mg, 58%).

Example B2

Preparation of Polymer 31

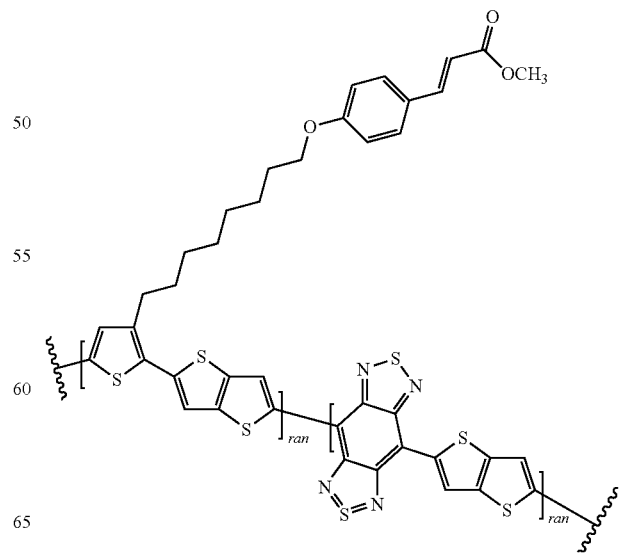

A solution of 4,8-dibromo-Benzo-[1,2-c:4,5-c']-bis[1,2,5]-thiadiazole (44 mg, 0.125 mmol), (E)-4-[4-[8-(2,5-dibromo-3-thienyl)octyloxy]phenyl]but-3-en-2-one (200 mg, 0.375 mmol), 2,5-Bis(trimethylstannyl)-thieno[3,2-bithiophene (233 mg, 0.50 mmol) and tetrakis(triphenylphosphine)palladium(0) (12 mg, 0.01 mmol) in 40 mL of NMP is stirred at 95° C. under Argon. After 2 h at 95° C., the reaction mixture is poured in HCl 1N and the precipitated is filtered off. The filtrate is extracted by using Soxhlet with MeOH, Acetone and finally with CHCl$_3$. The CHCl$_3$ fraction is concentrated and precipitated in acetone. The precipitated is filtered off and dried to afford polymer 31 as dark black powder (62 mg, 15%).

Example B3

Preparation of Polymer 32

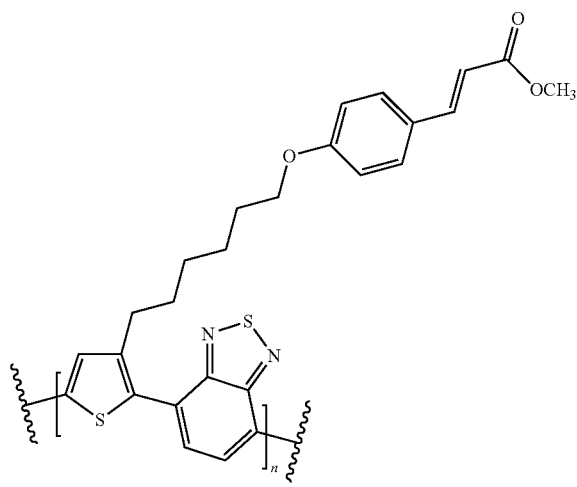

A solution of 2,5-dibromo-3-(6-bromohexyl)thiophene (362 mg, 0.72 mmol), 2,1,3-Benzothiadiazole-4,7-bis(boronic acid pinacol ester) (280 mg, 0.72 mmol), tetrakis(triphenylphosphine)palladium(0) (42 mg, 0.036 mmol), K$_2$CO$_3$ (500 mg, 3.6 mmol) and tetrabuthylbromide (5 mg, cat) in 35 mL of Toluene is stirred at 90° C. under Argon. After 2 h at 90° C., the reaction mixture is poured into a mixture of methanol and concentrated HCl (100:1.) The precipitated is filtered off, washed with methanol and the filtrate is extracted by using Soxhlet with Acetone and with CHCl$_3$. The CHCl$_3$ fraction is concentrated and precipitated in acetone. The precipitated is filtered off and dried to afford polymer 32 as black dark powder (290 mg, 87%). $^1$H NMR CDCl$_3$ 300 MHz: 8.23 (m, 1H), 7.99 (m, 1H), 7.83 (m, 1H), 7.63 (dd, 1H), 7.44 (d, 2H), 6.87(d, 2H) 7.00 (s 1H), 6.28 (d, 1H), 3.94 (t, 2H), 3.78 (s, 3H), 2.84 (t, 2H), 1.78 (m, 4H), 1.78 (m, 2H), 1.45 (m, 4H).

C) Application Examples

Example C1

Measurement of the Dichroism Behavior of Polymer 1

A solution containing 3.5% by weight photopolymer 1 in dichloroethane (C$_2$H$_4$Cl$_2$) is prepared. The solution S1 is spin-coated onto a fused silica substrate at a spin speed of 2000 rpm for 30 seconds and subsequently baked for 10 minutes at 110° C. yielding a thin polymer layer of approximately 250 nm of thickness. The photopolymer layer is then exposed to aligning light, which is linearly polarized light from a high pressure mercury lamp in the wavelength range from 280 to 340 nm. The aligning light is incident vertically (0°) onto the substrate. The exposure dose is 2000 mJ/cm$^2$. UV absorptions Ap($\lambda$) and As($\lambda$) are measured in the wavelength range from 190 nm to 700 nm with the light polarized parallel and perpendicular to the aligning light direction, respectively, using a Perkin Elmer spectrometer (Lambda 900). The dichroism calculated as A($\lambda$)=Ap($\lambda$)−As($\lambda$).

The dichroism is negative in the wavelength range from about 240 nm to 340 nm with the lowest value of around −0.04 at about 285 nm. Between 190 nm and 220 nm the dichroism is positive with a maximum value of about 0.013 at 190 nm. The lowest value for the dichroism is measured at a wavelength of approximately 286 nm (−0.13/μm) and the highest value at a wavelength of approximately (0.03/μm).

Example B2

Preparation of Liquid Crystal Photo-polymerisable Monomer Formulation S2

A solution of 29.1 wt % LCM1, 0.3 wt % photoinitiator I$_{RGACURE}$™ 369 from Ciba SC, 0.3 wt % of Tinuvine 123, and 0.3 wt % of BHT, is prepared using anisole as solvent. The solution is stirred for 30 minutes at room temperature and filtered on 0.20 μm PTFE hi-cap.

LCM1

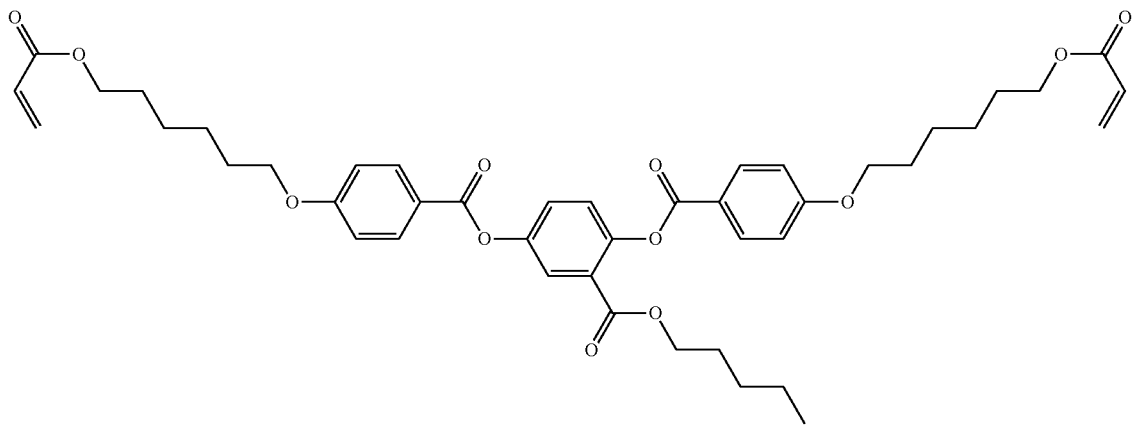

Example C3

General Procedure of Photo-orientation

A two percent by weight solution S1 of semi-conducting polymer is prepared in o-dichlorobenzene. The solution is stirred for 30 minutes at 80° C., cooled down and filtered on 0.20 μm PTFE hi-cap. The solution is spin-coated at 2000 rpm onto a glass substrate, which is then dried under vacuum for 12 h at room temperature and/or 10 min at 150° C. The substrate is subsequently irradiated with polarized UV light from a mercury high-pressure lamp, the direction of incidence being perpendicular to the substrate surface. For the polarization a Moxtec polarizer is used. The exposure energy of the polarised UV, using a Moxtec polariser, varied from 0 to 2000 mJ.cm$^{-2}$. The formulation S2 (example C2) is spin-coated at 800 rpm onto the substrate exposed with linearly polarised light, which is then dried for 30 seconds at 50° C. The resulting substrate is subsequently purged with nitrogen atmosphere for 30 seconds and then exposed with 1000 mJ.cm$^{-2}$ of isotropic UV light under nitrogen atmosphere. Alignment quality is observed with naked eye between crossed polarizers. The orientation of LC director i.e. the preferred direction along which the LC molecules are aligned, is determined with a Berek tilting compensator compatible to a Leitz polarized microscope.

Example C4

Application of Polymers 1 to 17 as Photoalignment Material

The orientation availability of polymers 1 to 17 is determined by following the procedure described examples C2 and C3.

| Polymer reference | Post-treatment | Orientation speed | LC orientation |
|---|---|---|---|
| Polymer 1 | 10 Min @ 150° C. | 500 mJ · cm$^{-2}$ | parallel |
|  | High vacuum 12 h | 250 mJ · cm$^{-2}$ | parallel |
| Polymer 3 | 10 Min @ 150° C. | Cross-linking | — |
|  | High vacuum 12 h | 1000 mJ · cm$^{-2}$ | parallel |
|  | High vacuum and 10 Min @ 150° C. | Cross-linking | — |
| Polymer 15 | 10 Min @ 150° C. | 1000 mJ · cm$^{-2}$ | parallel |
|  | High vacuum | 1000 mJ · cm$^{-2}$ | parallel |
|  | High vacuum and 10 Min @ 150° C. | 1000 mJ · cm$^{-2}$ | parallel |
| Polymer 7 | 10 Min @ 150° C. | bad @ 500 mJ · cm$^{-2}$ lost @ 1000 mJ · cm$^{-2}$ | parallel |
|  | High vacuum | 500 and 1000 mJ · cm$^{-2}$ | parallel |
| Polymer 11 | 10 Min @ 150° C. | Cross-linking | — |
|  | High vacuum 12 h | Cross-linking | — |
|  | High vacuum and 10 Min @ 150° C. | Cross-linking | — |
| Polymer 4 | 10 Min @ 150° C. | 500 mJ · cm$^{-2}$ | parallel |
|  | High vacuum 12 h | 250 mJ · cm$^{-2}$ | parallel |
| Polymer 16 | 10 Min @ 150° C. | 1000 mJ · cm$^{-2}$ | parallel |
|  | High vacuum 12 h | 250 mJ · cm$^{-2}$ | parallel |
|  | High vacuum and 10 Min @ 150° C. | 1000 mJ · cm$^{-2}$ | parallel |
| Polymer 8 | 10 Min @ 150° C. | Cross-linking | — |
|  | High vacuum 12 h | 1000 mJ · cm$^{-2}$ | — |
| Polymer 12 | 10 Min @ 150° C. | Cross-linking | — |
|  | High vacuum 12 h | Cross-linking | — |
| Polymer 5 | 10 Min @ 150° C. | Cross-linking | — |
|  | High vacuum 12 h | 1000 mJ · cm$^{-2}$ | parallel |
|  | High vacuum and 10 Min @ 150° C. | Cross-linking | — |
| Polymer 17 | 10 Min @ 150° C. | 2000 mJ · cm$^{-2}$ | parallel |
|  | High vacuum 12 h | 1000 mJ · cm$^{-2}$ | parallel |
|  | High vacuum and 10 Min @ 150° C. | 2000 mJ · cm$^{-2}$ | parallel |
| Polymer 9 | 10 Min @ 150° C. | Cross-linking | — |
|  | High vacuum 12 h | Cross-linking | — |
| Polymer 15 | 10 Min @ 150° C. | Cross-linking | — |
|  | High vacuum 12 h | Cross-linking | — |

Example C5

Contrast Measurements of Devices Prepared in Example C4

The device prepared example B4 is placed under a Leitz microscope with crossed polarizers and the light intensity is measured separately in bright and dark state by a photomultiplier connected to the microscope whose signal is measured by a digital voltmeter. Contrast ratios are calculated by using the following equation:

$$\text{Contrast} = V_{45°}/(V_{0°} - V_{Substrate})$$

Where $V_{0°}(V)$ is the minimal light intensity, i.e. the dark state $V_{45°}(V)$ is the maximal light intensity, i.e. the bright state $V_{Substrate}$ is the light intensity measured with the glass substrate and spin-coated B4 (without formulation S2)

Contrast ratios are determined for each energy and are reported in the table below.

| Polymer | UV-chromophore ratio | Contrast 0 mJ | 250 mJ | 500 mJ | 1000 mJ | 2000 mJ |
|---|---|---|---|---|---|---|
| Polymer 1 | 100% Cin | — | 749 | 3300 | 3950 | 4780 |
| Polymer 3 | 100% Cin | — | —• | —• | 1400 | 6030 |
| Polymer 15 | 75% Cin | — | — | — | 853 | 7490 |
| Polymer 7 | 50% Cin | — | —• | 154 | 173 | 6 |
| Polymer 4 | 100% CS-F | —• | 3640 | 3920 | 4030 | 4390 |
| Polymer 16 | 75% CS-F | —• | 3790 | 4470 | 4990 | 6770 |
| Polymer 8 | 50% CS-F | — | — | — | 187 | 560 |
| Polymer 5 | 100% CS-H | — | — | — | 1940 | 6590 |
| Polymer 17 | 75% CS-H | — | — | — | 29 | 8960 |

Example C6

Charge Carrier Mobility Determination from OFET Devices

Fraunhofer pre-patterned OFET substrates (generation 4) are successively washed 20 min in ultrasonic batch at 40° C. with a mixture of soap and water, deionized water, acetone, and isopropanol. The substrates are treated 30 min with UV-ozone and directly insert in a glove box. The washed substrates are passivated with HMDS and annealed 10 min at 135° C. A 0.8 percent by weight solution of semi-conducting polymer is prepared in o-dichlorobenzene. The solution is stirred for 30 minutes at 80° C. and spin-coated onto the substrate. The layer is dried under vacuum for 12 h at room temperature and the OFET behaviours are measured. The samples are irradiated with polarized UV light and the OFET behaviours are measured again. The OFET behaviours are reported in the table below

| Polymer (Ratio) | Irradiation | OFET behaviors | | | |
|---|---|---|---|---|---|
| | | Transistor | $\mu_{sat}$ | T-voltage | On/Off ratio |
| Polymer 1 (100% Cin) | 0 mJ | T1 (90°) | $7.16 \cdot 10^{-6}$ | 36.16 | — |
| | | T2 (0°) | $6.20 \cdot 10^{-6}$ | 37.53 | — |
| | | T3 (90°) | $6.61 \cdot 10^{6}$ | 37.64 | $3.37 \cdot 10^{3}$ |
| | | T4 (0°) | $8.46 \cdot 10^{-6}$ | 35.56 | $0.65 \cdot 10^{3}$ |
| | 1000 mJ·cm$^{-2}$ | T1 (90°) | $3.21 \cdot 10^{-6}$ | 45.4 | — |
| | | T2 (0°) | $2.45 \cdot 10^{-6}$ | 29.46 | $0.88 \cdot 10^{2}$ |
| | | T3 (90°) | $4.41 \cdot 10^{-6}$ | 46.74 | $1.15 \cdot 10^{2}$ |
| | | T4 (0°) | $2.92 \cdot 10^{-6}$ | 51.08 | $1.29 \cdot 10^{2}$ |
| Polymer 3 (100% Cin) | 0 mJ | T1 (90°) | $4.01 \cdot 10^{-5}$ | 23.20 | $4.33 \cdot 10^{3}$ |
| | | T2 (0°) | $4.07 \cdot 10^{-5}$ | 26.85 | — |
| | | T3 (90°) | — | — | — |
| | | T4 (0°) | — | — | — |
| | 1000 mJ·cm$^{-2}$ | T1 (90°) | $2.56 \cdot 10^{-5}$ | 36.60 | $4.95 \cdot 10^{3}$ |
| | | T2 (0°) | $2.75 \cdot 10^{-5}$ | 34.88 | $4.41 \cdot 10^{3}$ |
| | | T3 (90°) | $2.66 \cdot 10^{-5}$ | 35.45 | — |
| | | T4 (0°) | $2.46 \cdot 10^{-5}$ | 38.77 | — |
| Polymer 15 (75% Cin) | 0 mJ | T1 (90°) | $1.12 \cdot 10^{-4}$ | 16.35 | $2.9 \cdot 10^{4}$ |
| | | T2 (0°) | $1.19 \cdot 10^{-4}$ | 22.17 | — |
| | | T3 (90°) | — | — | — |
| | | T4 (0°) | — | — | — |
| | 1000 mJ·cm$^{-2}$ | T1 (90°) | $1.06 \cdot 10^{-4}$ | 30.51 | $4.83 \cdot 10^{4}$ |
| | | T2 (0°) | $1.08 \cdot 10^{-4}$ | 32.14 | $1.32 \cdot 10^{4}$ |
| | | T3 (90°) | $1.12 \cdot 10^{-4}$ | 32.88 | — |
| | | T4 (0°) | $1.16 \cdot 10^{-4}$ | 36.88 | — |
| Polymer 7 (50% Cin) | 0 mJ | T1 (90°) | $1.74 \cdot 10^{-4}$ | 38.62 | $0.81 \cdot 10^{4}$ |
| | | T2 (0°) | $2.12 \cdot 10^{-4}$ | 42.94 | — |
| | | T3 (90°) | — | — | — |
| | | T4 (0°) | — | — | — |
| | 1000 mJ·cm$^{-2}$ | T1 (90°) | $1.73 \cdot 10^{-4}$ | 39.32 | $1.32 \cdot 10^{4}$ |
| | | T2 (0°) | $2.12 \cdot 10^{-4}$ | 45.34 | $6.39 \cdot 10^{4}$ |
| | | T3 (90°) | $2.00 \cdot 10^{-4}$ | 43.84 | — |
| | | T4 (0°) | $2.19 \cdot 10^{-4}$ | 45.68 | — |
| Polymer 11 (25% Cin) | 0 mJ | T1 (90°) | $0.88 \cdot 10^{-2}$ | 41.04 | $1.99 \cdot 10^{5}$ |
| | | T2 (0°) | $0.53 \cdot 10^{-2}$ | 45.14 | — |
| | | T3 (90°) | — | — | — |
| | | T4 (0°) | — | — | — |
| | 1000 mJ·cm$^{-2}$ | T1 (90°) | $1.05 \cdot 10^{-2}$ | 42.00 | $0.70 \cdot 10^{5}$ |
| | | T2 (0°) | $0.55 \cdot 10^{-2}$ | 44.99 | $0.46 \cdot 10^{5}$ |
| | | T3 (90°) | $2.17 \cdot 10^{-3}$ | 48.09 | — |
| | | T4 (0°) | $1.68 \cdot 10^{-3}$ | 50.32 | — |
| P3HT (0% Cin) | 0 mJ | T1 (90°) | $5.61 \cdot 10^{-4}$ | 23.32 | $1.60 \cdot 10^{4}$ |
| | | T2 (0°) | $6.76 \cdot 10^{-4}$ | 19.31 | — |
| | | T3 (90°) | — | — | — |
| | | T4 (0°) | — | — | — |
| | 1000 mJ·cm$^{-2}$ | T1 (90°) | $5.62 \cdot 10^{-4}$ | 19.22 | $1.83 \cdot 10^{4}$ |
| | | T2 (0°) | $6.77 \cdot 10^{-4}$ | 19.22 | $4.65 \cdot 10^{4}$ |
| | | T3 (90°) | $5.29 \cdot 10^{-4}$ | 21.02 | — |
| | | T4 (0°) | $5.15 \cdot 10^{-4}$ | 20.94 | — |

Example C7

Orientation Test and Contrast Measurements of Devices Prepared in Example C6

The formulation S2 (example C2) is spin-coated at 800 rpm onto the OFET substrate exposed with linearly polarised light, which is then dried for 30 seconds at 50° C. The resulting substrate is subsequently purged with nitrogen atmosphere for 30 seconds and then exposed with 1000 mJ.cm$^{-2}$ of isotropic UV light under nitrogen atmosphere. The devices are placed under a Leitz microscope with crossed polarizers and the light intensity is measured separately in bright and dark state by a photomultiplier connected to the microscope whose signal is measured by a digital voltmeter. Contrast ratios are reported in the table below.

| Polymer (Ratio) | Irradiation | Contrast ratio |
|---|---|---|
| Polymer 1 (100% Cin) | 1000 mJ·cm$^{-2}$ | 1560 |
| Polymer 3 (100% Cin) | 1000 mJ·cm$^{-2}$ | 1570 |
| Polymer 15 (75% Cin) | 1000 mJ·cm$^{-2}$ | 483 |
| Polymer 7 (50% Cin) | 1000 mJ·cm$^{-2}$ | 123 |
| Polymer 11 (25% Cin) | 1000 mJ·cm$^{-2}$ | 1 |

The invention claimed is:
1. Compound of formula (I)

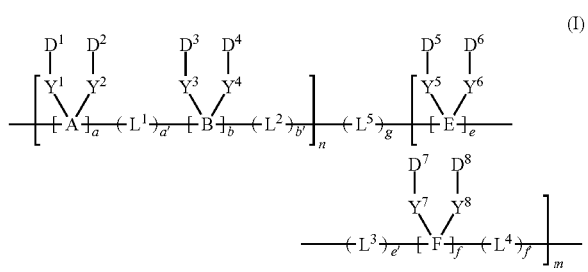

wherein
A, B, E and F independently from each other represents an unsaturated conjugated aliphatic group;
or A, B, E and F independently from each other represent an unsubstituted or substituted carbocyclic or heterocyclic aromatic group, wherein the carbocyclic or heterocyclic aromatic group is selected from
thiophene, fluorene, silafluorene, carbazole, pyridine, pyridazine, pyrimidine, furan, pyrrol and their derivatives,
$L^1$, $L^2$, $L^3$, $L^4$ and $L^5$ independently from each other represent a bridging group, which is selected from the group consisting of single bond, —NH—, —PH—, —CH=CH—,—CR$^5$=CH—, —C≡C— or a metallic system,
a, b, e and f are independently from each other of 1 to 0, with the proviso that the sum of a+b=1 and e+f=1,
a', b', e' and f' are independently from each other equal to a, b, e and f, respectively,
g is 0 or 1,
n and m are independently from each other 0 to 10000,
$Y^1$, $Y^2$, $Y^3$, $Y^4$, $Y^5$, $Y^6$, $Y^7$ and $Y^8$ are independently from each other a spacer, which is a single bond or a cyclic, straight-chain or branched, substituted or unsubstituted $C_1$-$C_{24}$ alkylene, wherein one or more $CH_2$, C, CH groups may independently from each other be replaced by a linking group and/or a non-aromatic, aromatic, unsubstituted or substituted carbocyclic or heterocyclic group connected via bridging groups and
$D^1$, $D^2$, $D^3$, $D^4$, $D^5$, $D^6$, $D^7$ and $D^8$ are independently from each other a hydrogen, —R$^1$, a halogen or a photoalignment group, selected from the group consisting of cinnamate group, cyanostilbene group, quinoline group and chalcone group;
wherein R$^1$ is a cyclic, straight-chain or branched, substituted or unsubstituted $C_1$-$C_{24}$alkyl, wherein one or more $CH_2$, C, CH groups, may independently from each other be replaced by a linking group and/or a non-aromatic, aromatic, unsubstituted or substituted carbocyclic or heterocyclic group connected via bridging groups, selected from —CH=CH—, —CR$^5$=CR$^5$—, —C≡C—, —CR$^5$=N—, —C(CH3)=N—, —N=N—, —NR$^6$—, —PR$^6$— or a single bond, wherein $R^5$, $R^{5'}$, $R^6$ are independently from each other hydrogen or $C_1$-$C_6$alkyl; or a cyclic, straight-chain or branched, substituted or unsubstituted $C_1$-$C_{24}$alkylen, wherein one or more $CH_2$ groups may independently from each other be replaced by a linking group;

and wherein the linking group is selected from —O—, —CO—, —CO—O—, —O—CO—, NR6-, —NR6-CO—, —CO—NR6-, —NR6-CO—O—, —O—CO—NR6-, —NR6CO—NR6-, —CH=CH—, —C≡C—, —O—CO—O—, and —Si(CH3)2—O—Si(CH3)2—, and wherein:

R6 represents a hydrogen atom or $C_1$-$C_6$alkyl;

with the proviso that oxygen atoms of linking groups are not directly linked to each other, with the proviso that n, g, and m are not 0 at the same time, with the proviso that at least one of $D^1$, $D^2$, $D^3$, $D^4$, $D^5$, $D^6$, $D^7$ and $D^8$ is a photoalignment group.

2. Compound according to claim 1, which is of formula (II)

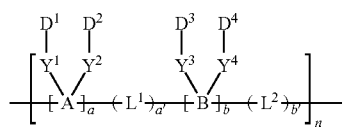

wherein

A and B independently from each other represents an unsaturated conjugated aliphatic group;

or A and B independently from each other represent an unsubstituted or substituted carbocyclic or heterocyclic aromatic group, wherein the carbocyclic or heterocyclic aromatic group is selected from thiophene, fluorene, silafluorene, carbazole, pyridine, pyridazine, pyrimidine, furan, pyrrol and their derivatives, $L^1$ and $L^2$ independently from each other represent a bridging group, which is selected from the group consisting of single bond, —NH—, —PH—, —CH=CH—, —$CR^5$=CH—, —C≡C— or a metallic system, a and b are independently from each other of 1 to 0, with the proviso that the sum of a+b =1, a' and b' are independently from each other equal to a and b, respectively, $Y^1$, $Y^2$, $Y^3$, and $Y^4$ are independently from each other a spacer, which is a single bond or a cyclic, straight-chain or branched, substituted or unsubstituted $C_1$-$C_{24}$ alkylene, wherein one or more $CH_2$, C, CH groups may independently from each other be replaced by a linking group and/or a non-aromatic, aromatic, unsubstituted or substituted carbocyclic or heterocyclic group connected via bridging groups and $D^1$, $D^2$, $D^3$, and $D^4$ are independently from each other a hydrogen, —$R^1$, a halogen or a photoalignment group, selected from the group consisting of cinnamate group, cyanostilbene group, quinoline group and chalcone group;

wherein $R^1$ is a cyclic, straight-chain or branched, substituted or unsubstituted $C_1$-$C_{24}$alkyl, wherein one or more $CH_2$, C, CH groups, may independently from each other be replaced by a linking group and/or a non-aromatic, aromatic, unsubstituted or substituted carbocyclic or heterocyclic group connected via bridging groups, selected from —CH=CH—, —$CR^{5'}$=$CR^5$—, —C≡C—, —$CR^5$=N—, —C(CH3)=N—, —N=N—, —$NR^6$—, —$PR^6$— or a single bond, wherein $R^5$, $R^{5'}$, $R^6$ are independently from each other hydrogen or $C_1$-$C_6$alkyl; or a cyclic, straight-chain or branched, substituted or unsubstituted $C_1$-$C_{24}$alkylen, wherein one or more $CH_2$ groups may independently from each other be replaced by a linking group;

and wherein the linking group is selected from —O—, —CO—, —CO—O—, —O—CO—, NR6-, —NR6-CO—, —CO—NR6-, —NR6-CO—O—, —O—CO—NR6-, —NR6CO—NR6-, —CH=CH—, —C≡C—, —O—CO—O—, and —Si(CH3)2—O—Si(CH3)2—, and wherein:

R6 represents a hydrogen atom or $C_1$-$C_6$alkyl;

with the proviso that oxygen atoms of linking groups are not directly linked to each other, with the proviso that at least one $D^1$, $D^2$, $D^3$, $D^4$ is a photoalignment group.

3. Method for the preparation of a compound of formula (I) according to claim 1, which method comprises coupling at least two compounds of formula (III)

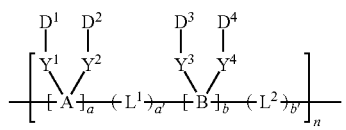

wherein $D^1$, $D^2$, $Y^1$, $Y^2$, and A have the meanings as described in claim 1, and $LG^1$, $LG^2$ represent independently from each other hydrogen or a leaving group.

4. Composition comprising at least one compound of formula (I) according to claim 1 and/or at least one compound according to formula (II) and/or formula (III):

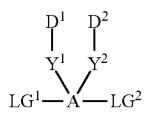

wherein

A, B, $L^1$, $L^2$, a, b, a', b', $Y^1$, $Y^2$, $Y^3$, $Y^4$, $D^1$, $D^2$, $D^3$, $D^4$ have the same meaning as described in claim 1, with the proviso that at least one $D^1$, $D^2$, $D^3$, $D^4$ is a photoalignment group;

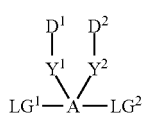

wherein $D^1$, $D^2$, $Y^1$, $Y^2$, and A have the meanings as described in claim 1, and $LG^1$, $LG^2$ represent independently from each other hydrogen or a leaving group.

5. Polymer, copolymer or oligomer layer, comprising at least one compound according to claim 1 or prepared by a method which comprises coupling at least two compounds of formula (III)

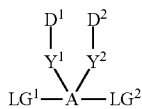
(III)

wherein

A represents an unsaturated conjugated aliphatic group;

or A represents an unsubstituted or substituted carbocyclic or heterocyclic aromatic group, wherein the carbocyclic or heterocyclic aromatic group is selected from thiophene, fluorene, silafluorene, carbazole, pyridine, pyridazine, pyrimidine, furan, pyrrol and their derivatives, $Y^1$ and $Y^2$ are independently from each other a spacer, which is a single bond or a cyclic, straight-chain or branched, substituted or unsubstituted $C_1$-$C_{24}$ alkylene, wherein one or more $CH_2$, C, CH groups may independently from each other be replaced by a linking group and/or a non-aromatic, aromatic, unsubstituted or substituted carbocyclic or heterocyclic group connected via bridging groups and $D^1$ and $D^2$ are independently from each other a hydrogen, —$R^1$, a halogen or a photoalignment group, selected from the group consisting of cinnamate group, cyanostilbene group, quinoline group and chalcone group;

wherein $R^1$ is a cyclic, straight-chain or branched, substituted or unsubstituted $C_1$-$C_{24}$alkyl, wherein one or more $CH_2$, C, CH groups, may independently from each other be replaced by a linking group and/or a non-aromatic, aromatic, unsubstituted or substituted carbocyclic or heterocyclic group connected via bridging groups, selected from —CH=CH—, —$CR^5$'=$CR^5$—, —C≡C—, —$CR^5$=N—, —C(CH3)=N—, —N=N—, —$NR^6$—, —$PR^6$— or a single bond, wherein $R^5$, $R^{5'}$, $R^6$ are independently from each other hydrogen or $C_1$-$C_6$alkyl; or a cyclic, straight-chain or branched, substituted or unsubstituted $C_1$-$C_{24}$alkylen, wherein one or more $CH_2$ groups may independently from each other be replaced by a linking group;

and wherein the linking group is selected from —O—, —CO—, —CO—O—, —O—CO—, NR6-, —NR6-CO—, —CO—NR6-, —NR6-CO—O—, —O—CO—NR6-, —NR6CO—NR6-, —CH=CH—, —C≡C—, —O—CO—O—, and —Si(CH$_3$)$_2$—O—Si(CH$_3$)$_2$—, and wherein:

R6 represents a hydrogen atom or $C_1$-$C_6$alkyl;

with the proviso that oxygen atoms of linking groups are not directly linked to each other, and $LG^1$, $LG^2$ represent independently from each other hydrogen or a leaving group.

6. Method for the preparation of a polymer layer, copolymer layer or oligomer layer, wherein one or more compound according to claim 1 or prepared according to a method which comprises coupling at least two compounds of formula (III)

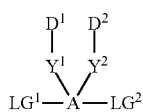
(III)

wherein $D^1$, $D^2$, $Y^1$, $Y^2$, and A have the meanings as described in claim 1, and $LG^1$, $LG^2$ represent independently from each other hydrogen or a leaving group, is applied to a support, and treated with aligning light.

7. Polymer, copolymer or oligomer layer obtainable by the method according to claim 6.

8. Optical and electro optical or optoelectronic elements and multi-layer systems comprising at least one polymer, copolymer or oligomer layer according to claim 5.

9. Optical and electro optical or optoelectronic elements and multi-layer systems comprising at least one polymer, copolymer or oligomer layer according to claim 7.

* * * * *